United States Patent
Jackson

(10) Patent No.: US 12,368,396 B1
(45) Date of Patent: Jul. 22, 2025

(54) MICROELECTROMECHANICAL SYSTEM RESONATORS

(71) Applicant: UNM Rainforest Innovations, Albuquerque, NM (US)

(72) Inventor: Nathan Morrow Jackson, Rio Rancho, NM (US)

(73) Assignee: UNM Rainforest Innovations, Albuquerque, NM (US)

( * ) Notice: Subject to any disclaimer, the term of this patent is extended or adjusted under 35 U.S.C. 154(b) by 802 days.

(21) Appl. No.: 17/455,833

(22) Filed: Nov. 19, 2021

Related U.S. Application Data

(60) Provisional application No. 63/117,129, filed on Nov. 23, 2020, provisional application No. 63/115,755, filed on Nov. 19, 2020.

(51) Int. Cl.
  *H02N 2/18* (2006.01)
  *H02N 2/00* (2006.01)

(52) U.S. Cl.
  CPC ............ *H02N 2/188* (2013.01); *H02N 2/181* (2013.01); *H02N 2/22* (2013.01)

(58) Field of Classification Search
  CPC ........... H02N 2/188; H02N 2/181; H02N 2/22
  See application file for complete search history.

(56) References Cited

U.S. PATENT DOCUMENTS

| | | | | |
|---|---|---|---|---|
| 7,414,351 | B2 * | 8/2008 | Ulm ...................... | H02N 2/22 |
| | | | | 310/330 |
| 12,075,703 | B1 * | 8/2024 | Jackson .............. | H10N 30/302 |
| 2013/0088123 | A1 * | 4/2013 | Haskett ................ | H10N 30/88 |
| | | | | 310/329 |
| 2013/0328446 | A1 * | 12/2013 | Horiguchi ............ | H10N 30/306 |
| | | | | 310/329 |
| 2015/0145376 | A1 * | 5/2015 | Sun ...................... | H10N 30/304 |
| | | | | 29/25.35 |
| 2016/0233413 | A1 * | 8/2016 | Zawada ................ | H02N 2/186 |
| 2016/0254437 | A1 * | 9/2016 | Yao ....................... | H10N 30/50 |
| | | | | 310/328 |
| 2020/0158564 | A1 * | 5/2020 | Yoon .................... | H10N 30/306 |
| 2022/0341964 | A1 * | 10/2022 | Zhou .................... | G01P 15/125 |

OTHER PUBLICATIONS

Halim, Miah Abdul, et al., "A Frequency Up-Converted Hybrid Energy Harvester Using Transverse Impact-Driven Piezoelectric Bimorph for Human-Limb Motion", Micromachines 10, 701., (2019), 14 pgs.

(Continued)

*Primary Examiner* — Emily P Pham
(74) *Attorney, Agent, or Firm* — Schwegman Lundberg & Woessner, P.A.

(57) ABSTRACT

In various embodiments, an apparatus can comprise one or more sliding mass cantilever devices. Cantilever devices can be structured as monolithic integrated structures with a mass coupled to a cantilever beam, where the mass has one or more cavities in which a liquid or solid particles are disposed. A cap can be arranged on the mass to prevent the liquid or solid particles from exiting the cavities in which they are embedded. The cantilever devices can be structured (Continued)

as microelectromechanical system (MEMS) resonators with a tunable resonant frequency. Such cantilever devices can be implemented as energy harvesting devices.

20 Claims, 14 Drawing Sheets

(56) References Cited

OTHER PUBLICATIONS

Jackson, Nathan, et al., "Sloshing liquid-metal mass for widening the bandwidth of a vibration energy harvester", Sensors and Actuators A, 284, (2018), 17-21.
Jackson, Nathan, et al., "Widening the bandwidth of vibration energy harvesters using a liquid-based non-uniform load distribution", Sensors and Actuators A 246, (2016), 170-179.
Shi, GE, et al., "A broadband piezoelectric energy harvester with movable mass for frequency active self-tuning", Smart Mater. Struct. 29, 055023, (2020), 11 pgs.
"U.S. Appl. No. 17/404,679, Notice of Allowance mailed Apr. 26, 2024", 8 pgs.
"Integration of Thick-Film Permanent Magnets for MEMS Applications", Journal of Microelectromechanical Systems, vol. 25, No. 4, Aug. 2016, (Aug. 2016), 9 pgs.
Andosca, Robert, et al., "Experimental and theoretical studies on MEMS piezoelectric vibrational energy harvesters with mass loading", Sensors and Actuators A 178 pp. 76-87, (2012), 12 pgs.
Anton, Steven R, et al., "A review of power harvesting using piezoelectric materials", Smart Materials and Structures 16 R1-R21, (2007), 22 pgs.
Berdy, D F, et al., "Increased-Bandwidth, Meandering Vibration Energy Harvester", Transducers'11, Beijing, China, Jun. 5-9, 2011, (Jun. 2011), 4 pgs.
Blevins, Robert D, et al., "Formulas for Natural Frequency and Mode Shape", Journal of Applied Mechanics Jun. 1980, vol. 47 / 461, (Jun. 1980), 2 pgs.
Challa, Vinod, et al., "A vibration energy harvesting device with bidirectional resonance frequency tunability", IOP Publishing Smart Materials and Structures, (2008), 11 pgs.
Choi, Dong-Hoon, et al., "Liquid-based electrostatic energy harvester with high sensitivity to human physical motion", Smart Mater. Struct. 20 (2011) 125012 (8pp), (2011), 9 pgs.
Cottone, F, et al., "Nonlinear Energy Harvesting", Physical Review Letters PRL 102, 080601 (2009), (Feb. 2009), 4 pgs.
Dawson, Karen, et al., "Fully integrated on-chip nano-electrochemical devices forelectroanalytical applications", Electrochimica Acta 115 pp. 239-246, (2014), 8 pgs.
Dickey, M. D, et al., "Eutectic Gallium-Indium (EGain): A Liquid Metal Alloy for the Formation of Stable Structures in Microchannels at Room Temperature", Adv. Funct. Mater., 18(7), (2008), 1097-1104.
Dickey, Michael D, et al., "Stretchable and Soft Electronics using Liquid Metals", Progress Report Soft Electronics Adv. Mater. 2017, 29, 1606425, (2017), 19 pgs.
Eichhorn, C, et al., "A smart and self-sufficient frequency tunable vibration energy harvester", J. Micromech. Microeng. 21 (2011) 104003 (11pp), (2011), 12 pgs.
Elfrink, R, et al., "Shock induced energy harvesting with a MEMS harvester for automotive applications", 2011 International Electron Devices Meeting, (2011), 4 pgs.
Elfrink, R, et al., "Vibration Energy Harvesting with Aluminum Nitride-Based Piezoelectric", Proceedings of PowerMEMS 2008+ microEMS2008, (Nov. 2008), 5 pgs.
Feng, Guo-Hua, et al., "Optimal FOM Designed Piezoelectric Microgenerator with Energy Harvesting in a Wide Vibration Bandwidth", Proceedings of the 2nd IEEE International Conference on Nano/Micro Engineered and Molecular Systems.
Feng, Guo-Hua, et al., "Optimal FOM Designed Piezoelectric Microgenerator with Energy Harvesting in a Wide Vibration Bandwidth", Proceedings of the 2nd IEEE International Conference on Nano/Micro Engineered and Molecular Systems Jan. 16-19, 2007, Bangkok, Thailand, (Jan. 2007), 4 pgs.
Gafforelli, Giacomo, et al., "Experimental verification of a bridge-shaped, nonlinear vibration energy harvester", Applied Physics Letters 105, 203901 (2014), (Nov. 18, 2024), 5 pgs.
Hajati, Arman, et al., "Ultra-wide bandwidth piezoelectric energy harvesting", Appl. Phys. Lett. 99, 083105 (2011), (Aug. 23, 2011), 4 pgs.
Huang, Po-Cheng, et al., "Wide-bandwidth piezoelectric energy harvester integrated with parylene-C beam structures", Microelectronic Engineering 111 (2013) 214-219, (2013), 6 pgs.
Jackson, Nathan, et al., "Broadening the bandwidth of piezoelectric energy harvesters using liquid filled mass", ScienceDirect Procedia Engineering 120 ( 2015 ) 328-332, (2015), 5 pgs.
Jackson, Nathan, et al., "Evaluation of low-acceleration MEMS piezoelectric energy harvesting devices", Microsyst Technol (2014) 20:671-680, (2014), 10 pgs.
Jackson, Nathan, et al., "Influence of aluminum nitride crystal orientation on MEMS energy harvesting device performance", J. Micromech. Microeng. 23 (2013) 075014 (9pp), (2013), 10 pgs.
Jackson, Nathan, et al., "Tuning MEMS cantilever devices using photoresponsive polymers", Smart Mater. Struct. 28 (2019) 085024 (8pp), (2019), 9 pgs.
Jackson, Nathan, et al., "Ultra-Low Frequency Piezomems Energy Harvester for a Leadless Pacemaker", Mems 2018, Belfast, Northern Ireland, UK, Jan. 21-25, 2018, (Jan. 2018), 4 pgs.
Jackson, Nathan, et al., "Ultralow-frequency PiezoMEMS energy harvester using thin- film silicon and parylene substrates", Journal of micro/nanolithography, MEMS, and MOEMS, (2018), 8 pgs.
Khan, Mohammad Rashed, et al., "Giant and switchable surface activity of liquid metal via surface oxidation", PNAS Sep. 30, 2014 vol. 111 no. 39, (Sep. 30, 2014), 5 pgs.
Liu, Huicong, et al., "Investigation of Piezoelectric MEMS-based Wideband Energy Harvesting System with Assembled Frequency-upconversion Mechanism", Procedia Engineering 25 (2011) 725-728, (Sep. 2011), 4 pgs.
Magno, Michele, "Combination of hybrid energy harvesters with MEMS piezoelectric and nano-Watt radio wake up to extend lifetime of system for wireless sensor nodes", ARCS 2013, (Feb. 2013), 6 pgs.
Marinkovic, B, et al., "Demonstration of wide bandwidth energy harvesting from vibrations", Smart Mater. Struct. 21 (2012) 065006 (5pp), (2012), 6 pgs.
Marzencki, Marcin, et al., "Integrated power harvesting system including a MEMS generator and a power management circuit", Science Direct—Sensory and Actuators A 145-146 pp. 363-370, (2008), 8 pgs.
O'Keeffe, Rosemary, et al., "Investigation into Modelling Power Output for MEMS Energy Harvesting Devices using COMSOL MultiphysicsR", 2013 14th International Conference on Thermal, Mechanical and Multi-Physics Simulation and Experiments in Microelectronics and Microsystems (EuroSimE), (2013), 6 pgs.
Olszewski, Oskar Zbigniew, et al., "A Mems silicon-based piezoelectric AC current sensor", Procedia Engineering 87 pp. 1457-1460, (Sep. 2014), 4 pgs.
Olszewski, Oskar Z, et al., "Evaluation of Vibrational PiezoMEMS Harvester That Scavenges Energy From a Magnetic Field Surrounding an AC Current-Carrying Wire", Journal of Microelectromechanical Systems, vol. 26, No. 6, Dec. 2017, (Dec. 2017), 8 pgs.
Rivadeneyra, Almudena, et al., "Tunable MEMS piezoelectric energy harvesting device", Microsyst Technol (2016) 22:823-830, (2016), 8 pgs.
Roylance, Lynn Michelle, et al., "A Batch-Fabricated Silicon Accelerometer", IEEE Transactions On Electron Devices, vol. ED-26, No. 12, Dec. 1979 1911-1917, (Dec. 1979), 7 pgs.
Shen, Dongna, et al., "The design, fabrication and evaluation of a MEMS PZT cantilever with an integrated Si proof mass for vibration energy harvesting", Journal of Micromechanics and Microengineering, (2008), 8 pgs.
Somukwar, Rohit, et al., "Wideband auto-tunable vibration energy harvester using change in centre of gravity", Microsystem Technologies (2018) 24:3033-3044, (2018), 12 pgs.

(56) References Cited

OTHER PUBLICATIONS

Zhu, D., et al., "Strategies for increasing the operating frequency range of vibration energy harvesters: a review", Measurement Science and Technology, 21(2), (2010), 022001 (29pp).

* cited by examiner

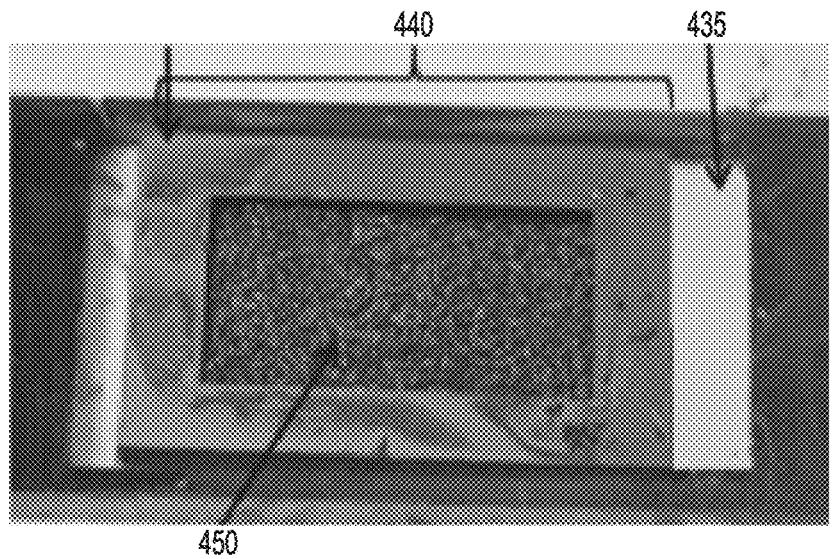
FIG. 4E
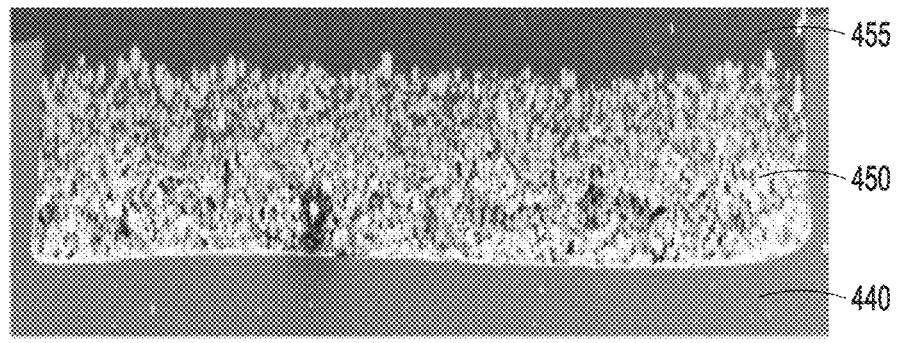
FIG. 4F
| MATERIAL | PIEZOELECTRIC d31 (pC/N) | POWER FIGURE OF MERIT | CMOS COMPATIBILITY |
|---|---|---|---|
| PZT | -44 | 1 | NO |
| BaTiO3 | -34.5 | 0.01 | NO |
| PVDF | 20 | 3.41 | YES |
| LiNbO3 | -1 | 10.46 | NO |
| AlN | -2 | 303 | YES |
| ZnO | -5.43 | 478 | NO |
FIG. 5

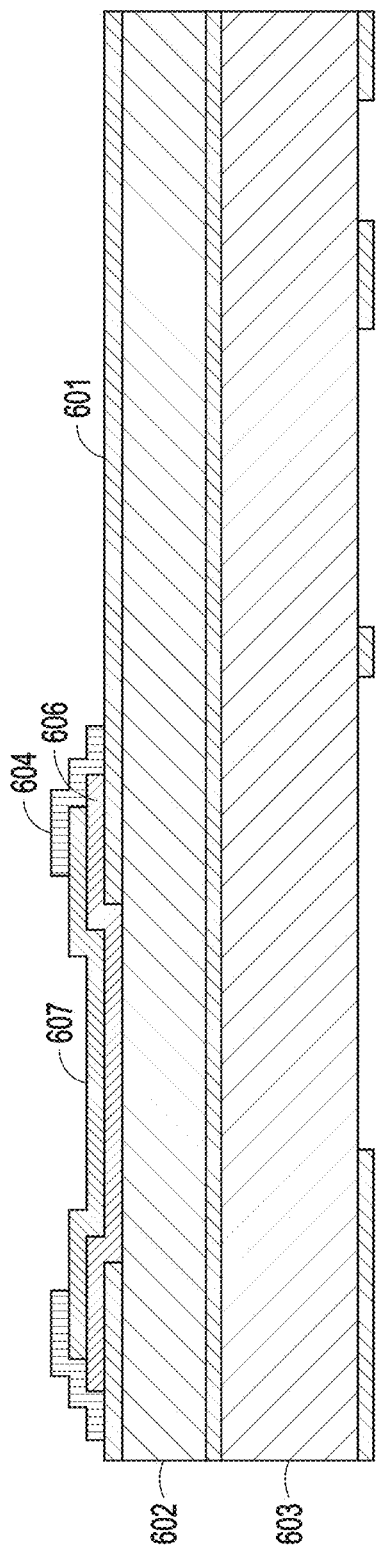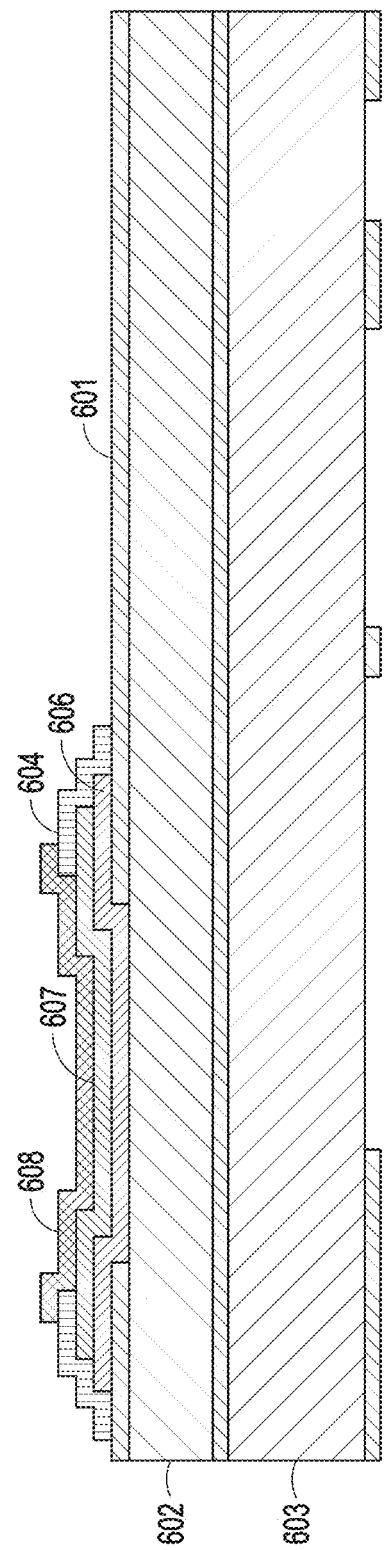

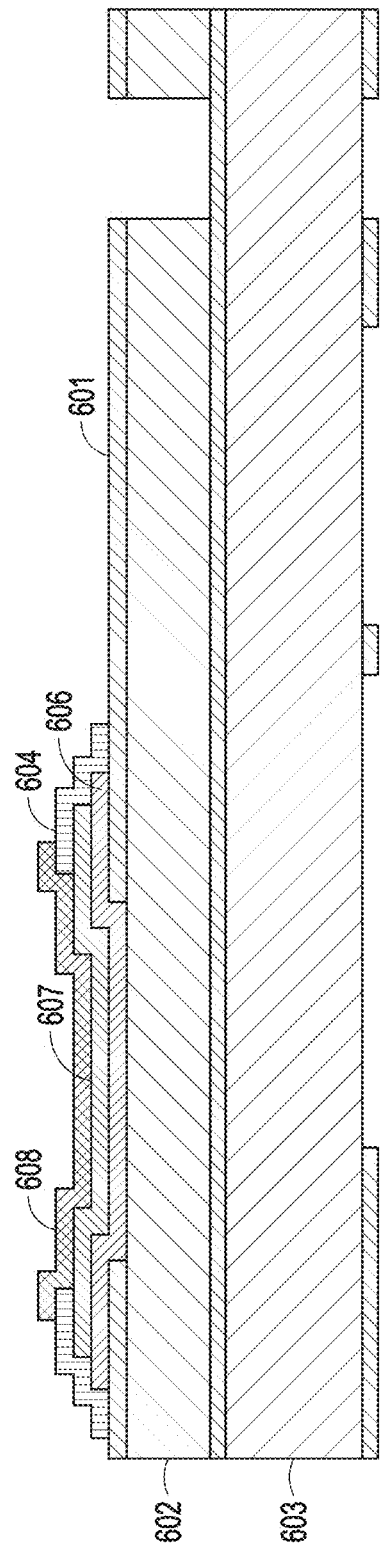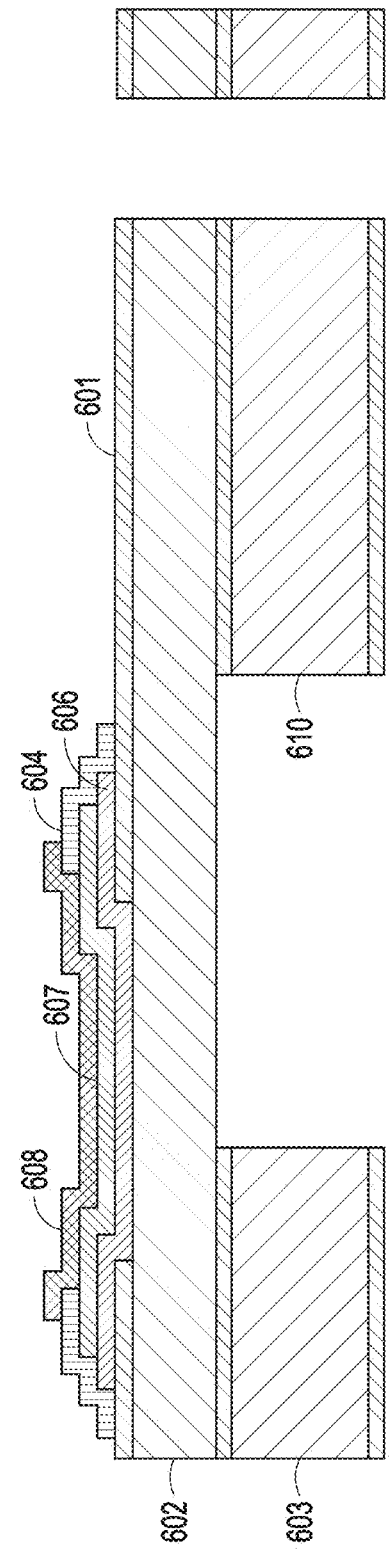

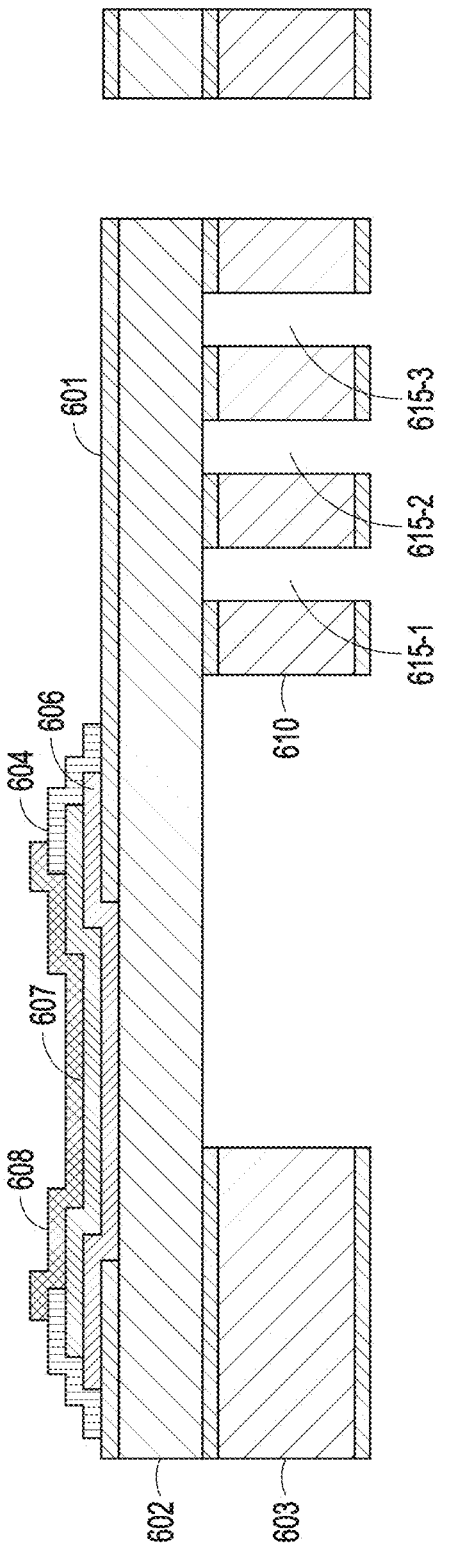
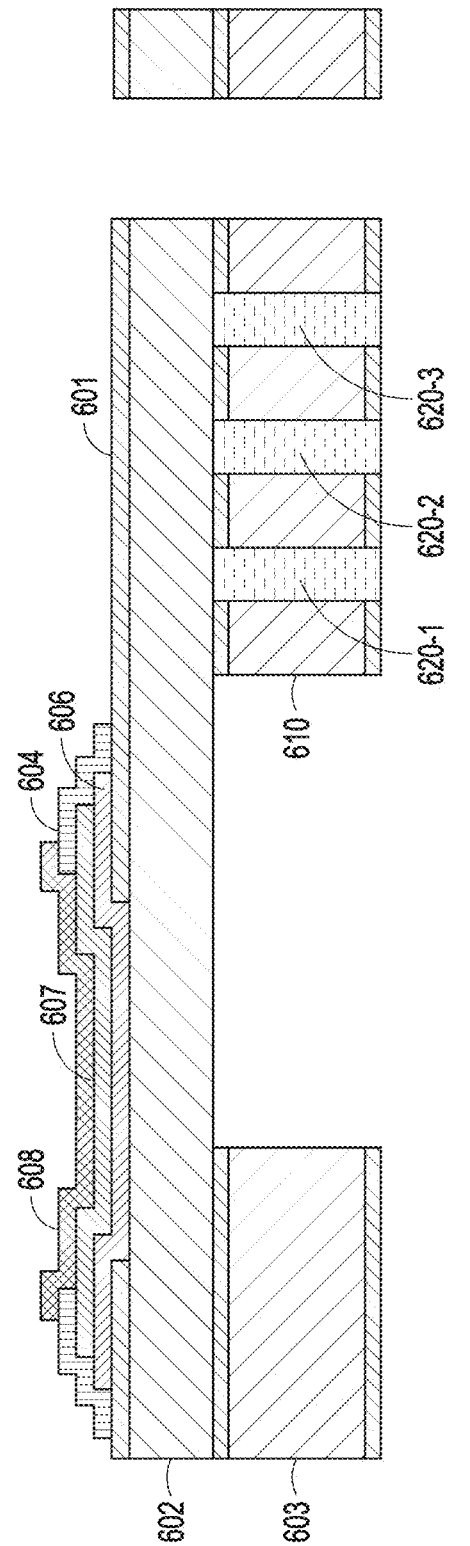

| DEVICE | LIQUID METAL AREA | ESTIMATED FREQUENCY (Hz) | FREQUENCY CHANGE (%) |
|---|---|---|---|
| 1 | 0 (ALL SILICON WITH CAVITIES) | 258.52 | 0% |
| 2 | 100 x 100 um | 258.26 | 0.10 |
| 3 | 500 x 500 um | 255.30 | 1.24 |
| 4 | 0.25 x 4 mm | 246.31 | 4.72 |
| 5 | 0.5 x 4 mm | 235.68 | 8.83 |
| 6 | COMBINE MASS (#5 & 3) | 233.23 | 9.78 |
| 7 | 4 x 4 mm | 8.40 | 96.75 |

FIG. 7

MICROELECTROMECHANICAL SYSTEM RESONATORS

CLAIM OF PRIORITY

This application claims the priority benefit of U.S. Provisional Application Ser. No. 63/115,755, filed 19 Nov. 2020, entitled "MONOLITHIC INTEGRATION OF SLIDING MASS FOR MEMS RESONATORS" and U.S. Provisional Application Ser. No. 63/117,129, filed 23 Nov. 2020, entitled "MANUFACTURING MEMS RESONATORS WITH TUNABLE FREQUENCY," which applications are incorporated herein by reference in their entirety.

BACKGROUND

The Internet of Things (IoT) has been defined as "[a]n infrastructure of interconnected objects, people, systems and information resources together with intelligent services to allow them to process information of the physical and the virtual world and react." See ISO/IEC JTC1, 2015. Cyber-physical systems (CPS) have been defined as "smart systems that include engineered interacting networks of physical and computational components." See Framework for Cyber-Physical Systems Release 1.0, May 2016, Cyber Physical Systems Public Working Group. The era for IoT and CPS is here, where conservative market estimates determined that the IoT industry will be in the hundreds of billions by 2021 with a significant annual growth of 10-30%. IoT and CPS aim to make significant advances in a wide range of applications including communications, health, energy, environment, and defense. However, one of the major bottlenecks for these devices is determining how to power them, as replacing batteries is not feasible for many applications such as structural health monitoring, drones, remote area monitoring, defense, etc.

Microelectromechanical systems (MEMS) can find application in the IoT and CPS with the implementation of MEMS cantilever resonator structures. MEMS cantilever resonator structures typically have high Q-factors (narrow bandwidths), which is useful for sensing applications. However, narrow bandwidths are typically not beneficial for energy harvesting applications. All of these applications can significantly benefit from enhancing energy harvesting device performance and fabrication of MEMS resonators.

BRIEF DESCRIPTION OF THE DRAWINGS

Embodiments of the invention are illustrated by way of example and not limitation in the figures of the accompanying drawings in which:

FIGS. 4A-4F illustrate is an illustration of microelectromechanical system structures, in accordance with various embodiments.

FIG. 5 is a table of power figure of merit for various piezoelectric materials, in accordance with various embodiments.

FIGS. 6A-6I are schematics of an example fabrication process of a piezoelectric microelectromechanical system energy harvester with embedded liquid mass, in accordance with various embodiments.

FIG. 7 is a table of numerical estimates of frequency using Galinstan with specific volumes, in accordance with various embodiments.

DETAILED DESCRIPTION

Figure 1A:
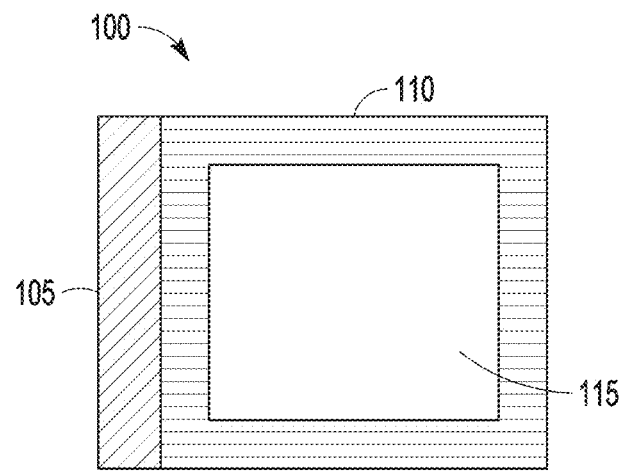
FIGS. 1A-1C illustrate material selectively etched away from specific areas of a mass to create a cavity, in accordance with various embodiments.

The following detailed description refers to the accompanying drawings that show, by way of illustration and not limitation, various example embodiments of the invention. These embodiments are described in sufficient detail to enable those skilled in the art to practice these and other embodiments. In order to avoid obscuring embodiments, some well-known system configurations and process steps are not disclosed in detail. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, microfabrication methods are used to create a sliding mass cantilever device. A primary application of such a device can include implementation in the area of micro-scale vibration energy harvesting devices. MEMS cantilever resonator structures typically have high Q-factors, where a high Q-factor means that the device oscillates at a very specific frequency. In order to maximize power harvested, the frequency of the MEMS resonator has to match the vibration source. If a device has a high Q-factor, the device only oscillates at that particular frequency, such that, if the vibration source does not match the device's frequency, then no power will be harvested. Most applications do not operate at a specific frequency but operate in a range of frequencies or the frequency of the source can change due to age, environmental conditions, and numerous other aspects. One or more of these conditions can be a major bottleneck that is preventing MEMS vibration energy harvesting devices from being commercially available, while the demand for energy harvesting systems is continuously growing due to the high demand for the IoT, which requires power to operate.

Various methods have been investigated to widen the bandwidth, but most of these use non-linear dynamics, repulsive forces, or other methods of decreasing the Q-factor. On the other hand, decreasing the Q-factor also significantly decreases the power that can be harvested, which can result in the relevant device not being useful because it cannot harvest enough to power the sensor, network, or other related device. Therefore, there is a demand for widening the bandwidth without significantly decreasing the power.

In various embodiments, methods can be implemented widening the bandwidth, while not significantly decreasing power. Such methods can be integrated with MEMS microfabrication of micro-scale resonators. A sliding mass can be created at the micro-scale in which bandwidth is widened, while not significantly decreasing power.

Typical cantilever structures are considered linear systems and can be modelled using a simple point mass at the center of gravity. These devices are said to have one specific resonant frequency. Frequency of a cantilever can be adjusted by changing the stiffness of the beam, weight of the mass, or dimensions of the cantilever according to basic beam theory. Changing any of these properties affects the resonant frequency.

In various embodiments, modification of the resonant frequency can be based on a sliding mass. If the center of gravity is changed, in essence, the length of the beam is changed and, thus, the resonant frequency is altered. Since changing the length is not feasible, the inventor has developed a method of creating a sliding mass. In the macro-scale, developing a sliding mass can be easy to achieve through various manufacturing methods, but, conventionally, at the micro-scale this can be very difficult to fabricate. An embodiment, taught herein, uses various methods to create a sliding mass that is compatible with microfabrication methods.

MEMS cantilevers typically combine a beam and a mass. The sliding mass can be based on embedding liquids or solid substrates in the mass. Thus, as the mass bends due to a vibration source, the embedded materials will move back and forth thus changing the center of gravity during operation and thus constantly changing the resonant frequency, such that one no longer has a single resonant frequency but instead the frequency is dependent on time and past frequencies. The concept is demonstrated in FIGS. 1A-3D. The method has been validated at the macro-scale, which demonstrated significant increase in bandwidth without reducing power. See articles, "Widening the bandwidth of a vibration energy harvesters using liquid-based non-uniform load distribution;" Nathan Jackson, Frank Stam, Oskar Olszewski, Hugh Doyle, Adian Quinn, Alan Mathewson; Sensors and Actuators A 246 (2016) 170-179, and "Sloshing liquid-metal mass for widening the bandwidth of a vibration energy harvester;" Nathan Jackson, Frank Stam; Sensors and Actuators A 284 (2018) 17-21, which articles are each incorporated by reference in their entirety. Embedding liquid or solid spheres into a macro-scale device can be achieved in a straightforward manner.

In various embodiments, monolithic integration of sliding mass for MEMS resonators can be implemented with liquids or solids embedded into a micro-scale device such that the liquids or solids are able to move due to a bending of a resonating beam. A MEMS cantilever mass can include a bulk semiconductor, such as bulk silicon, as the mass layer or a deposited film as the mass layer. A number of techniques can be used for embedding liquids or solids for both mass types.

Figure 1B:
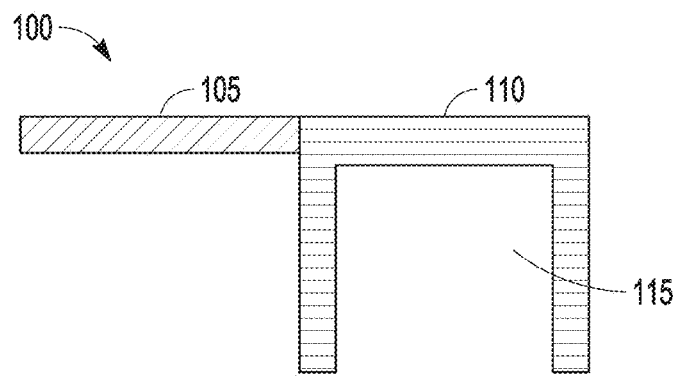

In an embodiment, a subtractive method can be implemented to form a MEMS cantilever mass. Consider a silicon (Si) mass. A silicon mass method can include etching bulk silicon either from a substrate or from a handle silicon wafer in a silicon-on-insulator wafer. The term handle with respect to a material refers to bulk form of the material. Using wet or dry etching techniques combined with photolithography patterning, the silicon can be selectively etched away from specific areas to create a cavity, as shown in FIGS. 1A-1B. FIG. 1A shows a top view of a beam-mass arrangement 100 having a beam 105 with a mass 110 attached at an end of the beam 105, where the cavity 115 has been created. After the device is released, liquid or spheres 120 can be inserted into the cavity 115 using liquid dispensing methods or other spray coating methods. A capping layer 125 can be bonded to the mass 110 using various wafer bonding techniques, which will prevent the liquid or spheres 120 from leaking out during operation. The beam-mass arrangement 100 of FIGS. 1A-1B filled with liquid or spheres 120 held in the cavity 115 with a capping layer 125 is shown in FIG. 1C.

In another embodiment, an appropriate mass can be fabricated using a deposition process or an additive manufacturing process. For example, such an alternative method to create the mass can use photolithography to pattern a thick mass using various photoresists such as SU-8. SU-8 is a commonly used epoxy-based negative photoresist. With respect to a photoresist, negative refers to a characteristic of the photoresist film in which portions of the photoresist film exposed to ultraviolet (UV) become cross-linked, while the remainder of the photoresist film remains soluble and can be washed away during development. Using this photoresist, masses of 1-1000 micrometers in dimension can be created in a straightforward manner. The shape and dimensions of the mass can be defined using photolithography, which can result in one large cavity or multiple cavities. Once the mass is created, the cavities can be filled with the appropriate liquid or spheres and capped using similar methods as previous described. An alternative method of creating the mass can include the use of additive manufacturing techniques to create a three-dimension (3D) printed mass. However, this technique is not completely compatible with standard MEMS fabrication techniques.

The liquid density and viscosity of the liquids used in the sliding mass are important in the performance of the device. The denser the liquid, the wider is the bandwidth as the sliding mass will have a larger impact on the change of center of gravity. In addition, the viscosity of the liquid plays a factor, as high viscous fluids use more force or larger displacements to get these fluids to slosh. In addition, during the microfabrication process, special coatings using gas deposited monolayers can be coated on the inside of the cavity to affect the hydrophobicity of the liquid or to act as lubrication for the spheres of the sliding mass.

Figure 1C:
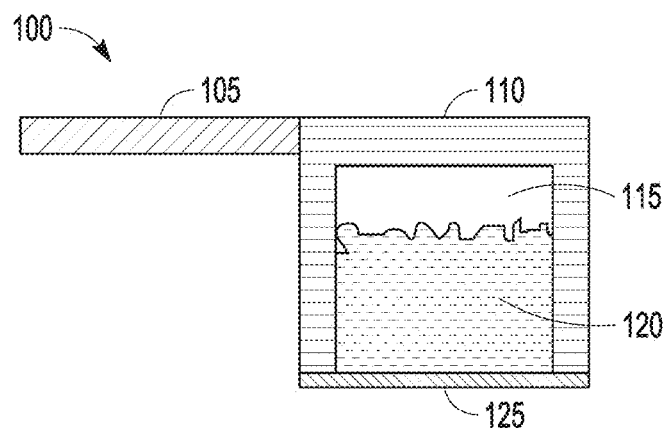

The capping layer, such as capping layer 125 of FIG. 1C, can be fabricated separately using various techniques. One technique can include reactive-ion etching (RIE) or deep reactive-ion etching (DRIE) of a substrate. Another technique can include using a thick resist and patterning it using photolithography. The capping layer can be aligned and bonded to the substrate using die bonding or wafer to wafer bonding. The bonding techniques can depend on the substrate. If a polymer is used as the capping layer, then thermocompression bonding can be used by activating the material in an oxygen ($O_2$) plasma. If silicon or Pyrex is used as the capping layer, then various bonding techniques can be used including anodic, intermediate layer bonding, or fusion bonding.

Figure 2A:
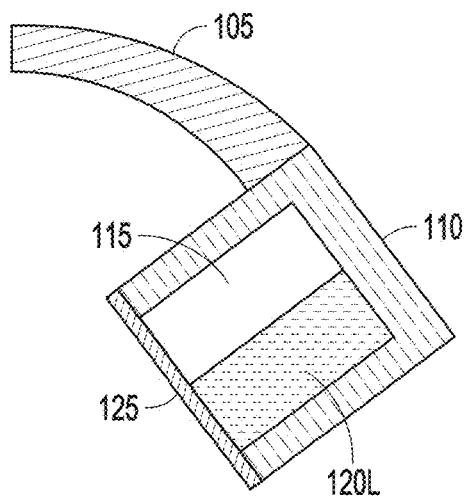
FIGS. 2A-2D illustrate a sliding mass based on embedding liquids or solid substrates in a mass, in accordance with various embodiments.
Figure 2B:
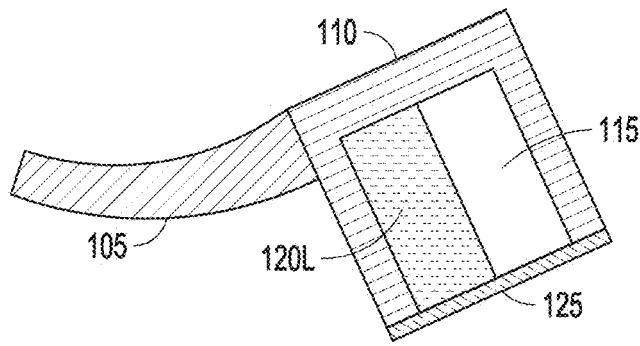
Figure 2C:
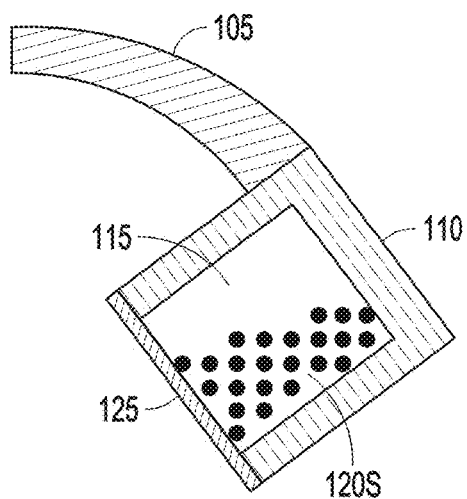
Figure 2D:
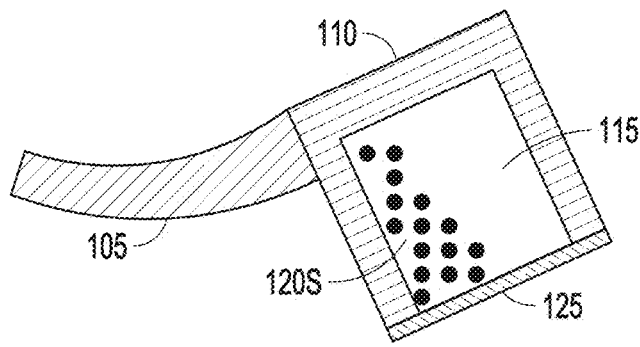

FIGS. 2A-2D illustrate use of a sliding mass based on embedding liquids or solid substrates in a mass 110. FIGS. 2A-2B show a liquid 120L as a sliding mass in the MEMS cantilever mass structure 100 of FIG. 1C, which includes beam 105, cavity 115, and capping layer 125. The beam 105 is bent upward in FIG. 2B in a direction opposite the downward bending direction in FIG. 2A, illustrating different shifts in the sliding liquid 120L. FIGS. 2C-2D show a set of particles 120S as a sliding mass in the MEMS cantilever mass structure 100 of FIG. 1C. The beam 105 is bent upward in FIG. 2D in a direction opposite the downward bending direction in FIG. 2C, illustrating different shifts in the sliding particles 120S.

Figure 3A:
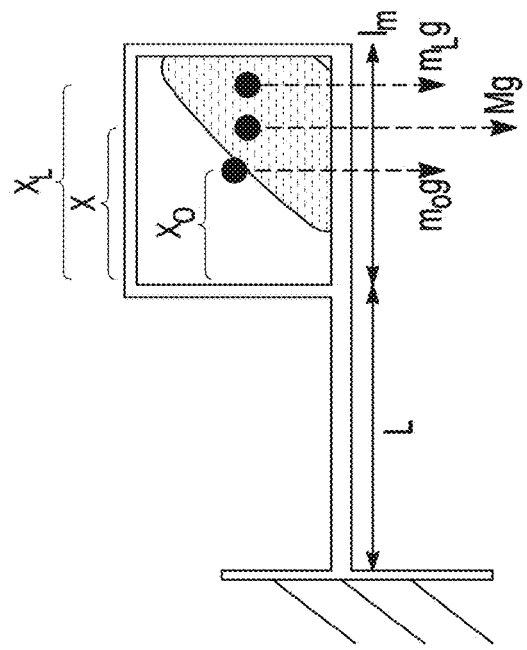
FIGS. 3A-3D illustrate side view schematics of a cantilever structure with force diagrams associated with centers of gravities of various components, in accordance with various embodiments.
Figure 3B:
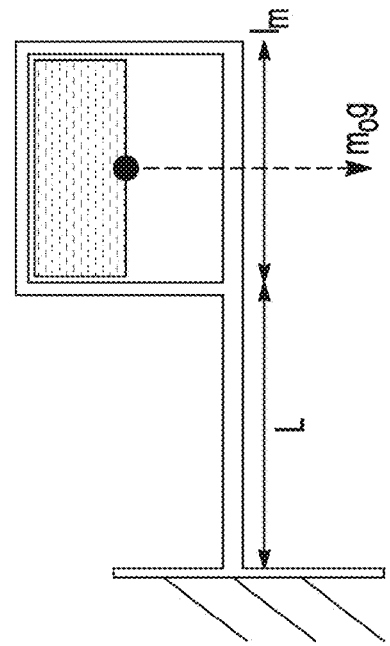
Figure 3C:
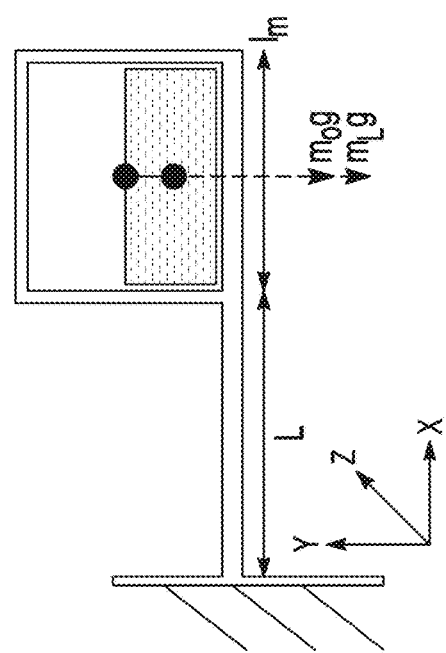
Figure 3D:
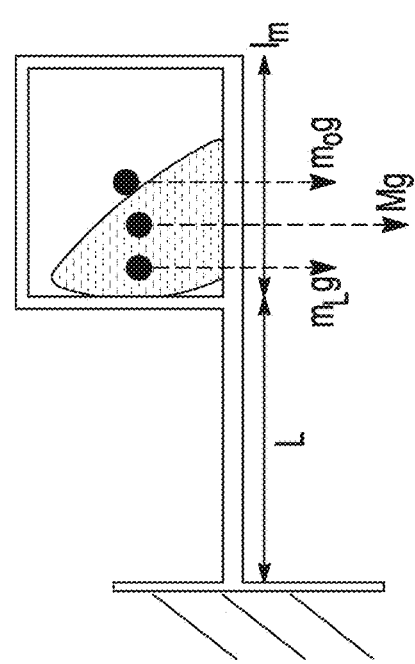

FIGS. 3A-3D illustrate side view schematics of a cantilever structure, similar to that of FIG. 1C, with force diagrams associated with the center of gravities of various components. In these figures, $m_o$ is the mass of the test mass, $m_L$ is the mass of the liquid, and $M_g$ is the mass at the center of gravity. FIG. 3A demonstrates the cantilever structure with a static liquid filled mass. FIG. 3B demonstrates liquid mass shifted to the distal end of the cantilever, representing a downward bend in the cantilever. FIG. 3C demonstrates liquid mass shift to the tethered end, representing an upward movement of the cantilever. FIG. 3D demonstrates high acceleration where the liquid is separated from the mass and is in free fall in which the liquid mass has no influence on overall mass.

In various embodiments, small tunable MEMS vibrational energy harvester (EH) can be implemented using embedded liquids. A universal piezoelectric MEMS vibrational EH can be fabricated to power CPS and IoT applications by tuning the resonant frequency during fabrication. Such fabrication can be compatible with batch fabrication processing at any large-scale or small-scale production MEMS facility.

With the growing demand for CPS and IoT applications there is an increasing desire to have self-sustaining systems. Typically, current technology requires these systems to be powered by batteries. However, batteries need to be replaced, which can be expensive and labor intensive, especially if the CPS or IoT system is in a remote area or difficult to reach location. Such applications can include structural health monitoring, sensors for drones, automotive, military etc. Therefore, there is a desire to replace batteries with a device capable of harvesting energy from the ambient environment that can allow the relevant system to be self-sustaining.

Vibrational energy harvesting is often the desired mechanism used over other energy harvesting methods because most applications have a vibration source that is constantly operating, unlike solar energy, for instance, that requires light. MEMS EHs are typically desired over bulk devices because the EH system should be a similar size as the battery that it is replacing. There has been extensive amount of research in MEMS vibrational EHs over the last decade, which have advanced the technology, but most of the advancement has been focused on increasing power density. However, these devices have struggled with commercialization due to several reasons. The devices and methods taught herein aim to solve one of these issues in order to increase the technology readiness level (TRL) of these devices, to allow them to make progress towards enhanced commercialization, which can lead to creating self-sustained CPS and IoT systems. TRLs, using a scale approach, provide for estimation of the maturity of a technology during the acquisition phase of a given technical. A technology's TRL is determined during a technology readiness assessment (TRA) that examines technology concepts, technology requirements, and demonstrated technology capabilities.

In various embodiments, a MEMS cantilever can be tuned by altering the mass and center of gravity using embedded liquids into the mass. A liquid can be selected as a sliding mass for two reasons. First, liquids have a wide range of densities, such as liquid metal (high density) to water or oils (low density). Secondly, liquid dispensing is widely used in MEMS fabrication. However, embedding liquids into a silicon mass can be a challenge. The embedded liquids, such as but not limited to liquids embedded into a silicon mass, can act as a stationary mass, during operation. Tuning the resonant frequency can be accomplished using additional liquid mass at end stages of the fabrication process. By controlling liquid densities, the amount of the liquid, and location of the embedded liquid, a wide range of tuning frequencies (20-250 Hz, for example) with accurate resolution of less than 1 Hz can be created. Such frequencies and resolution can generate significant advances in the TRL of MEMS EHs. Such fabrication techniques can be applied to future MEMS sensor applications and for CPS or IoT.

In various embodiments, a MEMS piezoelectric energy harvesting device can allow the CPS and IoT to be self-sustaining. MEMS energy harvesting device performance has increased significantly over the past decade, but currently no devices appear to be commercially available that can be applied to all types of CPS and IoT applications. Two major challenges that limit a MEMS EH device from being commercial are reliability and resonant frequency matching. With respect to reliability, these devices use large stress/strain to increase power density, but high stress decreases reliability. With respect to resonant frequency matching, there typically are problems with matching the resonant frequency of the device to the resonant frequency of the vibration source.

Each application or environment for the EH device can have a slightly different vibration frequency spectrum. If the resonant frequency of a given cantilever is 1-3 Hz different from the vibration source, then the power harvested can be significantly reduced due to the high Q-factor of the device. A high Q-factor is desired in order to increase the power density. Widening the bandwidth is possible but usually at the cost of reducing the Q-factor, which reduces the power density. Ideally, tuning the resonant frequency of the device to match the vibration source frequency is a better option than widening the bandwidth as the device will maintain high Q-factor resulting in high power density.

EH devices can be made with small changes in resonant frequency thru manufacturing slightly smaller cantilever length beams. For instance, a decrease of 10 μm from an 8 mm long cantilever beam can result in a frequency increase of approximately 1 Hz, so theoretically manufacturers can make devices for every single frequency and provide them to applications with known vibration frequencies. However, manufacturing EH devices for every single frequency would result in a cost that would be too high. Instead, a better approach is to fabricate a universal device, at least within a selected frequency range. Frequency ranges of typical energy harvesters are between 20-250 Hz. Therefore, there is a demand to develop a method of tuning MEMS energy harvesters from a range of 20-250 Hz with a 1 Hz resolution.

In various embodiments, a MEMS cantilever device can be tuned that is compatible with current MEMS fabrication techniques and that can be easily transferred to industry. In an embodiment, a pattern of cavities can be built into the cantilever mass. The resonant frequency can then be tuned by filling specific cavities with various density of liquids. The liquids are then capped to prevent leakage. The capping can be performed using a conformal room temperature chemical vapor deposited polymer, such as but not limited to parylene.

The embedded liquids can precisely tune the resonant frequency based on density, volume, and location, all of which can be easily and precisely controlled. Various liquids of the different density values can be used. For example, a dense liquid metal, such as but not limited to Galinstan, can be used. Galinstan is a family of eutectic alloys of gallium, indium, and tin, which are liquids at room temperature. A density of Galinstan is $\rho=6.44$ g cm$^{-3}$. A less dense liquid, such as but not limited to silicone oil with a density of $\rho=0.95$ g cm$^{-3}$ can be used. Volume can be tightly controlled using automatic liquid dispensing, which can also be programmed to fill specific cavities. Cavity dimensions can be patterned down to 10 μm×10 μm, using standard photolithography and etching techniques. By varying different liquids densities, varying volume, and location of the cavities, precise resolution of less than 1 Hz can be achieved for the range of 20 Hz-250 Hz. The initial device can be structured to have a resonant frequency equal to the maximum resonant frequency that is desired, as adding mass will result in decreasing the resonant frequency. This technology can help lead to the next generation of EHs by increasing the TRL. The technology also has potential uses in other applications by developing new microfabrication techniques.

Liquids can be used because liquid dispensing machines are routinely found in MEMS manufacturing plants for depositing materials such as epoxy and other liquids. Embedded powders can be used as previously demonstrated, but it is more difficult to dispense the precise amount and transferring the technology to a large MEMS facility would be more difficult, as micro and nano-powders could lead to contamination.

Figure 4B:
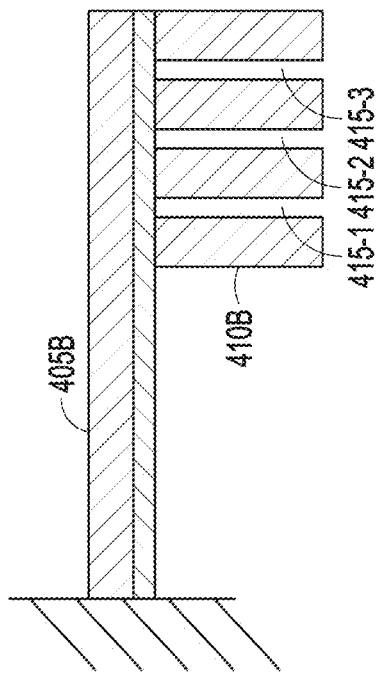
Figure 4D:
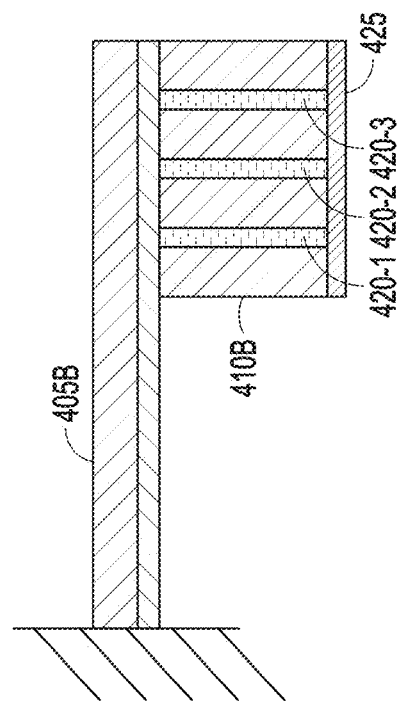
Figure 4A:
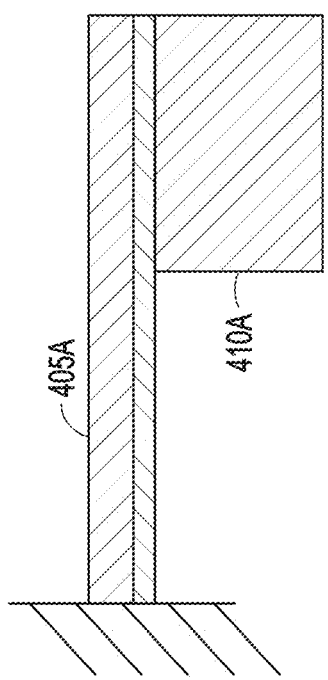
Figure 4C:
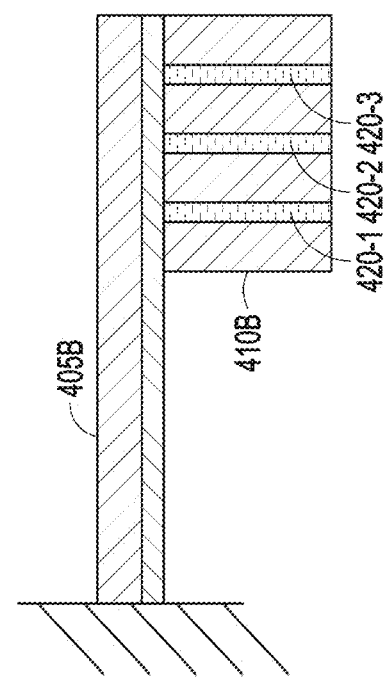

FIGS. 4A-4D show schematics of fabricating a device embedded with material providing a sliding mass. FIG. 4A illustrates typical MEMS cantilever EH having a silicon beam 405A with a silicon mass 410A. FIG. 4B illustrates a fabricated silicon-on-insulator (SOI) device having cavities 415-1, 415-2, and 415-3 etched into the mass 410B attached to beam 405B. FIG. 4C shows the device of FIG. 4B after the cavities 415-1, 415-2, and 415-3 are filled with liquids 420-1, 420-2, and 420-3, respectively. FIG. 4D shows the device of FIG. 4C after the liquid-filled cavities are capped with cap 425, providing an operational device. FIGS. 4E-4F shows top view and a cross-sectional, respectively, a fabricated device having a beam 435 with embedded magnetic powders 450 in a mass 440 capped with parylene 455 to create an embedded permanent magnet mass for an application different from an EH.

One or more procedures can be used with respect to monolithic integration of a sliding mass for MEMS resonators. Embedded liquids implemented to tune a cantilever on a micro-scale can be validated at the macro-scale. A finite element model can be used to predict the resonant frequencies for specific patterns of embedded liquids. A protocol can be implemented for dispensing and capping the embedded liquid in a MEMS device without leaking. A piezoelectric MEMS energy harvester having a liquid embedded mass can be implemented with a tuning capability and specified resolution.

Different methods of tuning the resonant frequency for an EH device have been attempted but they provide low range tuning, are not MEMS fabrication compatible, or use active tuning that requires power. Adding mass to a cantilever is known to alter the resonant frequency, but currently methods of adding mass are not MEMS compatible. The method described herein, which creates embedded liquids or particles in a mass, is MEMS compatible, uses passive tuning, and can cover a wide range of frequencies. In addition, these methods can enable researchers and manufactures to build energy harvesters for a wide range of CPS and IoT applications.

The demand for CPS and IoT is going to continue to increase over the next decade, and there is extensive research on developing new systems, sensors, communication, and networking to try and enhance the performance and reduce possible cyber-attacks. Currently, each system or device requires unique features that are specific to that application. However, there is one component that every CPS or IoT system requires and that is power. Currently, all of these systems are powered by batteries, but batteries lose energy after a certain amount of time depending on how much power the CPS or IoT systems require to function and transmit information. Losing power to a system not only requires labor to change the battery, which could be intensive in hard to reach locations, but the amount of time it takes to change the battery means the CPS or IoT is not operating, which can be costly and lead to numerous problems depending on the application. Therefore, the ideal solution is to replace the batteries with an energy harvesting device in order to create a self-sustaining system that is substantially always operational.

The size of the EH system should be around the same size as the battery for the relevant application or smaller, and thus the ideal solution is a MEMS based EH. Harvesting energy to power these devices is a critical path towards the expansion of the IoT and should be resolved in order for the IoT market to be used in our daily lives. There are various types of energy harvesting methods such as photovoltaics, vibrational, and thermoelectric. Devices and methods as taught herein focus on vibrational as most application have a vibration source, whereas photovoltaics are only beneficial in areas that have light and thermoelectrics typically need large temperature gradients.

Three main types of vibrational EHs include piezoelectric EHs, electromagnetic EHs, and electrostatic EHs. Electrostatic EHs typically generate lower power than the other two and require an electrical bias, which takes away from the amount of harvested power. Therefore, efficiency of electrostatic EHs is usually low. Electromagnetic EHs is an option for macro-scale devices as they can be easily designed and manufactured, but electromagnetic energy harvesters typically have low voltage and microfabricating them at the MEMS scale is challenging, as they require a bulk permanent magnet that is not CMOS (complementary metal-oxide-semiconductor) compatible. Piezoelectric EHs on the other hand are easy to integrate into a MEMS process and have been used in radio frequency (RF) resonators and sensors commercially for years. Piezoelectric EHs generate high voltage which makes the electronic circuits required for power management easier. However, the teachings herein can be applied to any resonating MEMS device.

FIG. 5 is a table 500 of power figures of merit for various piezoelectric materials. There are many different piezoelectric materials that have been applied to EHs, but aluminum nitride (AlN) is one of the most popular because of its CMOS compatibility. In addition, AlN has a high-power figure of merit compared to other piezoelectric materials as shown in the table 500 of FIG. 5, which is due to its low dielectric constant. Piezoelectrics convert mechanical energy into electrical energy as the material is strained/stressed. When applied to a cantilever beam that oscillates due to an applied force from the ambient environment, a stress in the piezoelectric material converts the vibrational force into usable electrical energy. A complete energy harvesting system can include the energy harvesting device, a DC rectifier, power management circuit, and energy storage.

MEMS EHs can be implemented as piezoelectric MEMS (PiezoMEMS) EHs. PiezoMEMS EHs have been extensively researched over the past decade. However, most of the research to date has focused on increasing power density as typical wireless sensor networks (WSN) require around 100-1000 µW cm$^{-3}$. With advances in piezoelectric material properties and design properties, the power density levels are approaching the required values. High power densities of up to 2.5 mW cm$^{-3}$ have been attained. There is still a demand to continue to increase power densities, but recently researchers have been more focused on applying these energy harvesters to specific applications. These devices have demonstrated good performance at the prototype or research level, but there are major challenges at increasing the TRL so these devices could be used commercially. There are still major challenges associated with lower TRLs that researchers need to address to enhance device performance such as reliability and matching the resonant frequency of the cantilever with the frequency of the vibration source. There has been extensive research into addressing the later issue including increasing bandwidth and active tuning methods during operation. Numerous attempts have been made to reduce the Q-factor by increasing the bandwidth. These include bistable magnets, mechanical stoppers, sliding mass, use of non-linear dynamics and numerous other methods. However, the problem with these techniques is the power densities are significantly reduced by orders of magnitude, so the devices cannot meet the power requirements for typical applications. To a lesser extent, researchers have tried to address the needs of tuning the device post-fabrication by using both active and passive methods including repelling forces, altering the elastic modulus of cantilever, and laser trimming devices. None of these are practical or compatible with current MEMS techniques.

PiezoMEMS EHs are currently at a low TRL. Two major challenges that are limiting these devices from going commercial according to numerous sources are reliability and uniqueness of each device. A problem with vibrational EHs is that each application has a unique frequency spectrum, so if one wants to place an EH on a car engine, bridge, or drone, a custom made EH has to be developed for each application. Also, different models of an application have different frequencies. For example, consider car engines. A 4-cylinder engine from one manufacturer can have different frequencies than a 4-cylinder engine from another manufacturer. This makes manufacturing EHs very difficult as they would need to make specific devices for each application and for each customer, which is not feasible. This issue of creating devices for each application is a huge concern.

Manufacturers want to batch fabricate devices to make billions of devices, with little or no interest in making a thousand devices for each customer as that is low production, and not economical. Even though each application has a unique frequency, almost all applications have a low frequency component that is between 20 Hz and 250 Hz, and the accelerations are typically less than 1 g. Therefore, there is a strong need to develop a method of tuning the resonant frequency in the range of approximately of 20 Hz to approximately 250 Hz, so that a single device can be manufactured and tuned later to meet customer requirements for a specific application. The resolution of the tuning should be within 1 Hz, which is the typical bandwidth of a Si MEMS cantilever. Tuning cantilevers can be accomplished through numerous techniques as the frequency of a rectangular beam is given by the following formula (1), where E is the elastic modulus, m is the mass, w, t, and L are the width, thickness, and length of the cantilever.

$$f = \frac{1}{2\pi} * \sqrt{\frac{3E}{m}} * \sqrt{\frac{wt^3}{L^3}}$$

The width, thickness and length are difficult to alter after the initial fabrication without using advanced laser trimming methods, which is expensive and not possible during batch fabrication. Fundamental research was conducted by the inventor on using smart materials (photoresponsive polymers) to alter the elastic modulus, but this method is at the fundamental level. The other option is to change the mass. Mass can be added but it is difficult to remove mass. Concepts have been validated by using pick-and-place machines to add mass to the cantilever, but this method leads to undesirable topography, which would affect the packaging of the MEMS device and uses adhesion promoters.

An approach taught herein is to create cavities in the mass and then fill the cavities with liquids to create an embedded liquid mass. Various liquids can be used to create a wide range of tuning capabilities. For instance, highly dense liquid metal, such as but not limited to Galinstan can be used for large tuning, whereas liquids like water or silicone oil can be used for low frequency tuning. Unlike other mass tuning approaches, this approach of embedding liquids in cavities is completely compatible with MEMS fabrication techniques and can be easily implemented by any MEMS fabrication facility.

Piezoelectric MEMS EH can be used as a vehicle of embedding liquids to tune cantilevers, but the approach of embedding liquids to tune cantilevers can be applied to other resonating MEMS devices. In energy harvesting, the same concepts can be applied to electromagnetic EHs, and the concept can also apply to any other resonating mechanical structure both at the MEMS-scale or macro-scale. An example approach herein is to provide a user who requests a specific frequency EH to be able to get a device with a resonant frequency at the specific frequency. For example, for a desired specific frequency of 119 Hz, a user can obtain a 119 Hz resonant frequency device. By using specific liquids, cavity dimensions, and location on the cantilever, a library of data can be available to let the user know how to fill their cantilever to get the desired frequency. Following this approach, a manufacturer can fill a cantilever according to a customer's request or a customer can fill the cantilever using appropriate tooling.

In various embodiments, tuning the resonant frequency of a MEMS EH by embedding liquids into cavities in the mass of the MEMS EH can be implemented that is compatible with standard MEMS fabrication techniques. It is well known that the frequency of a cantilever can be altered by changing the mass as demonstrated in equation (1). However, equation (1) is a simplified formula which assumes a point mass. It has been numerically and experimentally verified by the inventor that changing the center of mass can also be used to alter the resonant frequency of a cantilever beam. Therefore, by placing mass in specific locations of a MEMS EH, both frequency and center of gravity can be altered by adding mass.

Cavities in the mass can be created using various techniques. The cavities can be etched into the mass. The mass to be etched can be but is not limited to a silicon mass. For example, other masses can be used similar to semiconductor-related substrates used in integrated circuits. An alternative method to create a mass with cavities can be accomplished using a material similar to SU-8 and photolithography. Etching into a mass is a subtractive method, while the photolithography approach is an additive approach, where the mass is created using photoresist polymers. An advantage of the silicon etching technique is that it uses standard silicon etching capabilities, which are widely used, but a disadvantage can be the use of SOI wafers, which can be expensive and may be difficult to control etch depth. The additive technique of using a material like SU-8 does not require SOI wafers, and various thicknesses of the mass can be easily deposited using different spin speeds to deposit layers of the material. In addition, since SU-8 is less dense than silicon, the effect of the liquid densities can have a more significant impact, resulting in a wider range of tuning.

FIGS. 6A-6I are schematics of an embodiment of an example fabrication process of a piezoelectric MEMS EH with embedded liquid mass. An SOI wafer can be used with sputtered metal/AlN/metal, where a handle silicon can act as the mass, which can have cavities etched into it using DRIE. Then, based on the amount of tuning desired, liquids can be dispensed into the cavities and capped. Parylene, which is able to be deposited onto liquids because of the unique deposition methods at room temperature, can be used as a capping material. Parylene has previously been demonstrated to adhere to liquids and act as a capping layer. Other materials can be used as a capping layer.

Figure 6A:
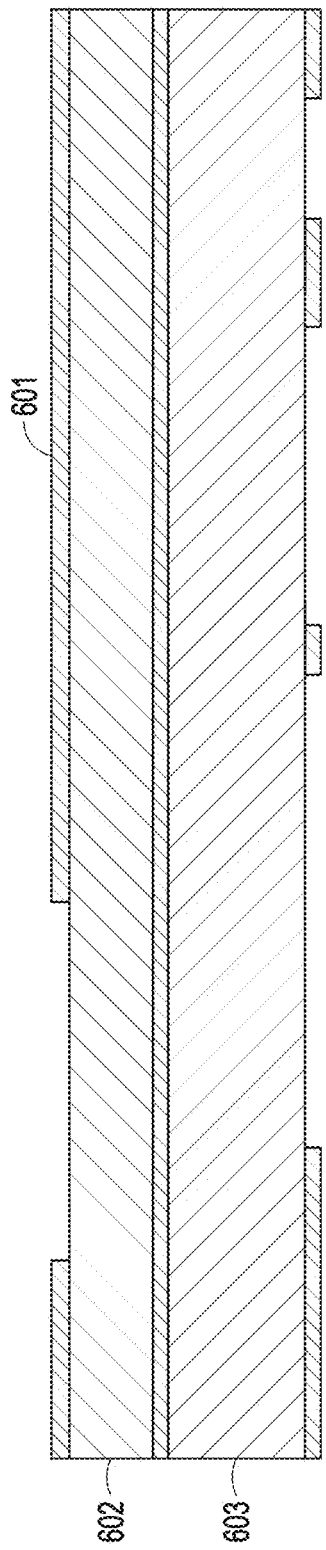
Figure 6B:
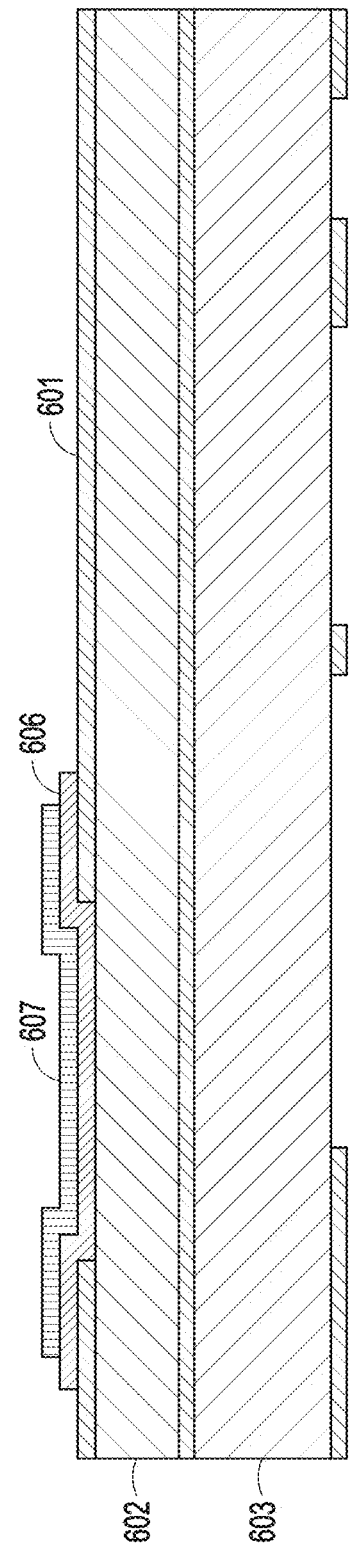

FIG. 6A shows an oxide 601 patterned on device silicon 602 that is disposed on bulk silicon 603. FIG. 6B shows the structure of FIG. 6A after depositing an AlN layer 607 and a titanium (Ti) layer 606. FIG. 6C shows the structure of FIG. 6B after depositing oxide 604. FIG. 6D shows the structure of FIG. 6C after depositing a top Al layer 608. FIG. 6E shows the structure of FIG. 6D after DRIE etching device silicon 602.

Figure 6I:
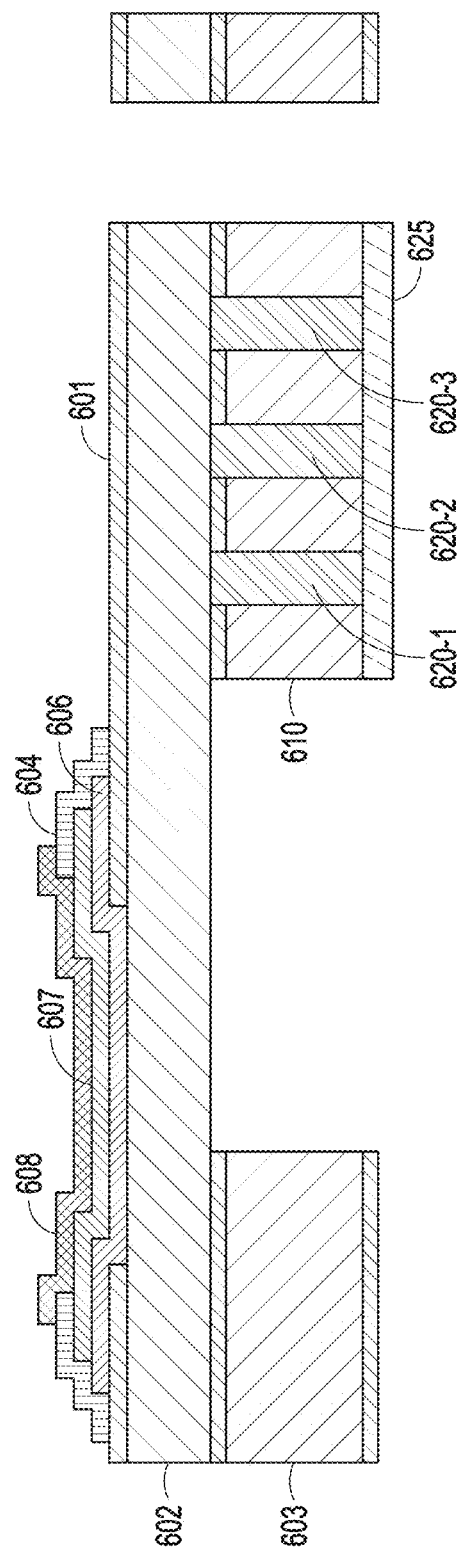

FIG. 6F shows the structure of FIG. 6E after DRIE etching bulk (handle) silicon 603 to provide a mass 610 in which cavities can be formed. FIG. 6G shows the structure of FIG. 6F after etching cavities 615-1, 615-2, and 615-3. The number of cavities can be more or less than three cavities. FIG. 6H shows the structure of FIG. 6G after filling cavities 615-1, 615-2, and 615-3 with different liquids 620-1, 620-2, and 620-3. Alternatively, the same liquid can be placed in cavities 615-1, 615-2, and 615-3. FIG. 6I shows the structure of FIG. 6H after forming capping layer 625 to cover the different liquids 620-1, 620-2, and 620-3 filling the cavities 615-1, 615-2, and 615-3. Other materials can be used in the process shown in FIGS. 6A-6I.

The additive technique of developing an SU-8 mass is not shown but can use a silicon wafer with metal/AlN/metal, followed by formation of an SU-8 mass, which can be spin coated and patterned. The patterning can be performed using photolithography. The Su-8 mass can be created on the top surface followed by a DRIE etch of the silicon to release the device. Then, the procedure for the formation of the embedded liquid can be performed in the same manner or similar manner as with the silicon etching procedure.

Figure 8:
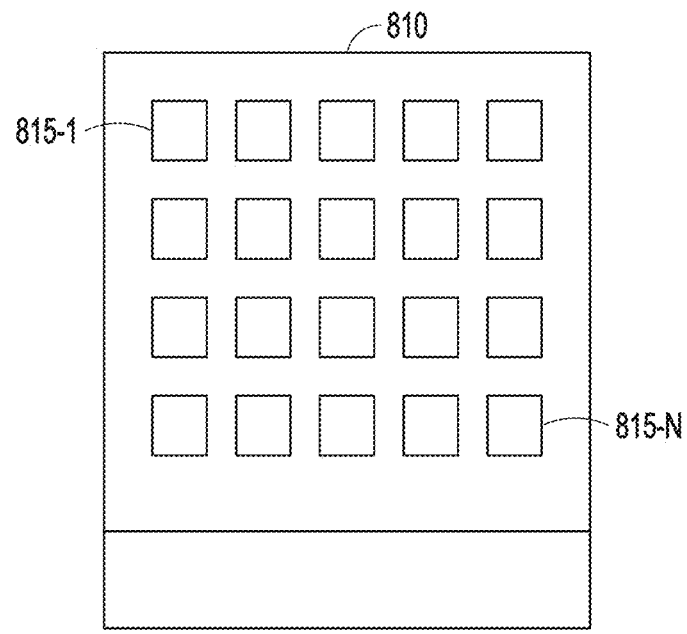
FIG. 8 is a schematic of an array of cavities within a mass, in accordance with various embodiments.

Based on numerical modelling and basic finite element modelling (FEM) simulations, it is anticipated that frequency tuning from 250-20 Hz can be attained with resolutions of less than one Hz. Given a standard MEMS device of 5 mm width, 10 mm in length, and 40 µm thickness with a mass of 8 mm by 5 mm can result in a cantilever with a resonant frequency of around 258 Hz±5%. Typically, FEM and numerical simulations can be approximately 5% off due to manufacturing errors. Using a liquid metal, such as Galinstan with density of 6.44 g cm$^{-3}$, a reduction of about 0.3 Hz can be attained with a 100×100 µm cavity. FIG. 7 is a table 700 of numerical estimates of frequency using Galinstan with specific volumes. The results of different mass combinations using Galinstan are shown in the table 700 of FIG. 7. If the majority of the mass is filled with liquid metal, such as the 4×4 mm shown in device #7 in table 700, the resonant frequency can be approximately 8 Hz. Therefore, by filling specific areas and specific amounts one can get a tunable frequency range of 8-258 Hz with a 0.3 Hz resolution. Device #6 in table 700 demonstrates filling multiple cavities in order to attain increased precision. Dispensing 100×100 µm can result in nL dispensing, which is within the capability of dispensing machines. Different patterns for the cavities may be investigated, but an initial array of small cavities 815-1 . . . 815-N as shown in FIG. 8 can be used. FIG. 8 is a schematic of an array of cavities 815-1 . . . 815-N within the mass 810.

Figure 9:
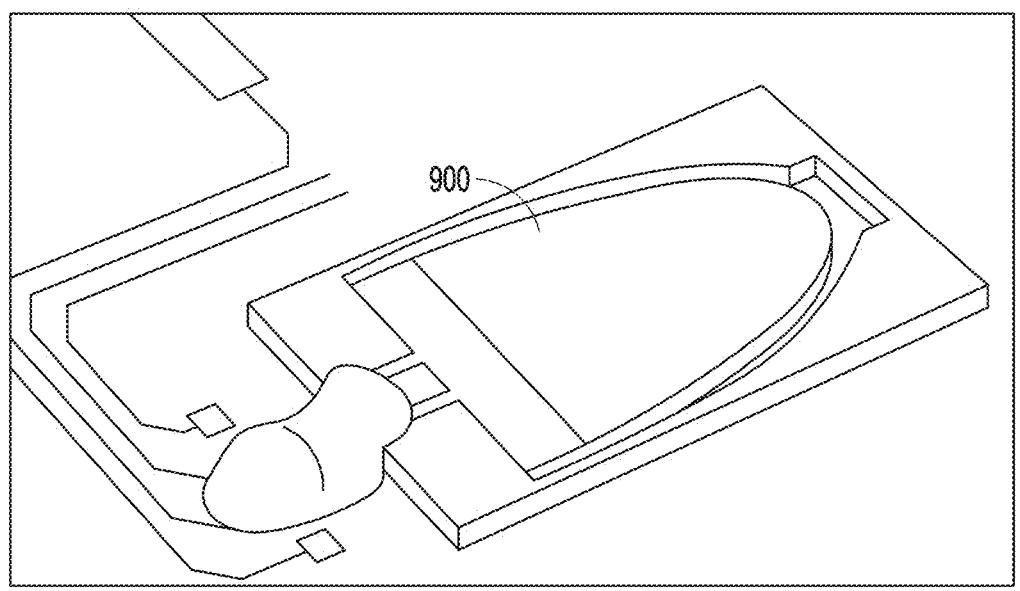
FIG. 9 is a schematic of a fabricated microelectromechanical system energy harvester with scale bar of four millimeters, in accordance with various embodiments.

FIG. 9 illustrates a fabricated MEMS energy harvester 900 with scale bar of 4 mm. This would allow individual cavities to be filled as desired and with different liquids to get more accurate precision tuning. However, a detailed array and cavity dimension may be considered. Automated dispensing methods can be programmed to fill specific locations depending on the desired resonant frequency. Automated dispensing machines can easily identify cavities and fill them up as instructed. The automated process can be performed quickly and can be easily adjusted in the future resonant frequency. An initial library of patterns and liquids may be generated that could be used to create a wide range of frequencies. Additional data over time can be added to such a library so that customers or manufactures could identify what type of liquid, how much, and where to dispense the liquid for any range of frequencies.

Experimental and numerical analysis can be used to evaluate devices and methods. Initially, a mass with embedded liquids can be validated by using macro-scale (scaled up versions), which can include bulk piezoelectrics with a 3D printed mass to define the various cavity locations. Different liquids can be used to verify that these liquids can be used to alter the frequency, using a vibration shaker. Then, FEM can be used to validate the principles taught herein using numerical simulations. FEM can also be used to design the MEMS device and location of the cavities along with shape of cavities. Then, MEMS devices can be fabricated, first using a dummy device with no piezoelectric material in order to validate the tuning capabilities. Then, to validate the mass with embedded liquids at its intended application, a complete piezoMEMS energy harvesting device with embedded liquids can be fabricated. The liquid dispensing and the capping procedure can be optimized prior to making the MEMS device.

Even with extensive research, MEMS vibrational energy harvesters are still not at high TRL due to several issues. One issue is the difficulty to make a universal device for all applications. The one thing that a wide range of companies all have in common is the problem with manufacturing these devices in bulk. Industry cannot afford to design and manufacturer thousands of different types of energy harvesters with various resonant frequencies for each application. Therefore, there is a need to develop a manufacturing process that can allow companies to produce millions of the same device and be able to meet frequency requirements for specific applications.

In various embodiments, tuning the resonant frequency of a cantilever using embedded liquids can be performed at back-end stages of the manufacturing process. Liquids can be embedded into a silicon MEMS device, where the liquids can range from dense liquids like liquid metals (Galinstan) to low dense liquids like silicone oils. A capping procedure can be implemented to prevent liquid from leaking out of the cavity. The inventor has developed a process for capping powders in embedded silicon cavities using a room temperature parylene deposition technique, which can be applied to liquids due to the unique deposition techniques of parylene. By embedding the cavities with liquids with different densities, and at different locations and dimensions, there are effectively an infinite number of frequencies that could be generated.

These methods will not only significantly advance the MEMS energy harvesting area by increasing the TRL so that devices can be manufactured by batch fabrication methods, but these methods can also make a significant advancement in MEMS fabrication. These methods can be applied to various other MEMS devices, which can have significant impact on CPS and IoT applications in the form of sensors, acoustic resonators, and actuators. Embodiments of MEMS energy harvesting devices with embedded liquids can be used to create self-sustaining WSN for CPS and IoT applications.

In various embodiments, tuning the resonant frequency of a MEMS cantilever device using embedded liquids can be implemented with experiments conducted using several test vehicles to evaluate use of different materials for embedded liquids and patterns of locations of the embedded liquids in the mass of the MEMS cantilever device. Evaluation can be conducted in a number of ways including testing a macro-scale of the energy harvester, through FEM simulation, and at the MEMS scale. Experimentation and testing can include macro-scale testing, design of MEMS energy harvester, and MEMS fabrication and validation. Macro-scale testing can be used to focus on validating the tuning of the resonant frequency using embedded liquids by using a macro-scale version of a MEMS energy harvesting device. Design of MEMS energy harvester can focus on FEM simulation, pattern design of cavity, and methods of dispensing various liquids. MEMS fabrication and validation can include developing MEMS devices to validate the design at the intended application and scale. Dummy devices can be developed to validate the different materials for embedded liquids and patterns of locations at the MEMS scale and develop a full functional MEMS energy harvesting device with embedded liquid tuning capabilities. Testing can include evaluation of the tuning capabilities of selected liquids on a macro-scale EH device, the optimization of dispensing various liquids, and the validation at the MEMS scale level.

An initial test vehicle for macro-scale evaluation can include a macro-scale piezoelectric beam with a custom manufactured mass. Macro-scale device can be used since macro-scale devices are easier to manufacture and are often used to evaluation of a MEMS device. A macro-scale device using bulk piezoelectric material, along with a custom mass that can contain various cavities with individual ones of the cavities being filled with liquid. Then, the energy harvester can be characterized for power as a function of frequency. For example, the characterization can be conducted using a vibration shaker. This macro-scale setup can allow investigation of different liquids and their effects on frequency as well as location of cavities. The bulk device can include a removable lid to prevent leakage into other cavities.

Consider the design and development of a macro-scale energy harvester. The macro-scale energy harvester can include a bulk piezoelectric material, which can be commercially purchased such as lead zirconate titanate (PZT). A rectangular beam substrate can be used with electrical connections made to portions of the substrate. A mass can be designed and manufactured using a 3D printer using materials such as nylon, acrylonitrile butadiene styrene (ABS), or poly (lactic acid) (PLA) also known as polylactic acid or polylactide. The overall device can be a scaled-up version of a MEMS device with scale factor of approximately 5-10×. As an alternative to a 3D printed version, a plexiglass mass can be machined using standard manufacturing of plexiglass. The 3D printed mass allows one to easily change the cavity locations and dimensions. A lid consisting of O-rings and screws can be attached to the mass after liquid has been dispensed to prevent leakage. Various liquids can be used such as liquid metals and silicone oils as well as low density liquids. The mass can be bonded to the piezoelectric cantilever.

Consider characterization and evaluation of various embodiments. After a macro-scale device is developed, it can be evaluated, for example, using a vibration shaker. A custom chuck can be machined to secure the device to the vibration shaker. The vibration shaker can precisely control acceleration and frequency. A frequency sweep can be performed to determine the resonant frequency of the device without any liquid in the mass. Then, various liquids at different locations can be added to determine the change in resonant frequency. The voltage or power amplitude can be monitored as well as the bandwidth to verify that there are no other effects from the embedded liquids.

After evaluation of the macro-scale device, a finite element modelling a MEMS device can be implemented using COMSOL Multiphysics software. Initially, the device may only consist of a dummy device without added piezoelectric and metal layers, but as the model is developed the device can become more complex. A two-dimensional (2D) model may initially be used and then advanced to a full 3D model. FEM model allows removal of areas and insertion of masses with various densities, and enables examination of stress, frequency, displacement, and power output. In addition, methods of dispensing the liquid in silicon and SU-8-based cavities and optimizing the capping procedure can be investigated. The dispensing methods and FEM simulations can be combined to investigate specific patterns and cavity dimensions. The FEM simulation can be used to investigate potential affects due to locations of the cavities.

A FEM of a cantilever device can be developed, for example, using COMSOL. A 2D model can be developed first which can lead to a 3D model. The simulation can investigate stress values to ensure the beam does not facture, as well as resonant frequency and power. The resonant frequency can be used to evaluate the implemented method from a simulation. Cavities can be developed in the model and filled with a mass. To ease the computational efforts, a solid mass can be used instead of liquid as adding liquid to the complex model may cause problems, and essentially with the capping layer the liquid will not be able to flow, so modelling the liquid as a solid liquid is justified. In a device with is no flowing liquid, the liquid can be assumed to be a stationary solid material.

Consider embedded liquid optimization to focus on dispensing the various liquids and capping them to prevent leakage. Using an automated dispensing system, a program can be generated to dispense a small amount of liquid. First, a silicon wafer can be patterned and anisotropically etched using DRIE to a depth of approximately 300 μm, where different shape patterns of cavities can be developed across the wafer. A SU-8 (thick photoresist) can also be used to create cavities in an additive layer approach. Various liquids can be used such as, but not limited to, Galinstan and silicone oil, where the dispensing protocol can be adjusted for the different liquids, such as time, pressure, back pressure, and inner diameter (ID) of needle. The various liquids can be dispensed and monitored for accuracy and precision. In addition to optimizing the dispensing of the liquids, the capping protocol can be addressed. Silicon wafer pieces can be placed in a parylene deposition machine, which can deposit a thin (10-20 μm) layer of parylene. Parylene deposition starts out as a dimer and can be cleaved into a monomer at elevated temperature and, once it reaches room temperature, it conformally deposits on the surface. Parylene can be used as a capping material because it deposits at room temperature, and it is highly conformal and has been demonstrated by the inventor to deposit on water to create spherical coatings. Other materials and dimensions may be used.

Consider cavity patterning, which can be based on information combined from developing the FEM and the embedded liquid optimization. Based on the droplet size that can be produced and the dimensions of the cavities, the cavities can be incorporated into the FEM. Sharp corners can be avoided as these are high stress areas, which can lead to cracking. FEM can look at specific patterning such as simple square array or other types of patterning. For instance, cavities filled away from the center could cause the $2^{nd}$ resonant mode to decrease, which can increase bandwidth by combining $1^{st}$ and $2^{nd}$ mode. This configuration can be analyzed using FEM frequency analysis. At the end of this analysis, a MEMS design can be produced with dimensions and cavities (dimensions and locations), which can feed into other activities such as the development of a dummy MEMS device.

A MEMS EH can be fabricated with the tuning technique at the MEMS scale evaluation. After a dispensing protocol has been developed and a design of the MEMS device, fabrication of dummy devices can proceed. The dummy device can include a silicon beam and a silicon mass, but the device need not have any active metal or piezoelectric films. These devices are easier to fabricate and can function for evaluation at the MEMS scale. After the dummy devices are evaluated, fabrication of the full devices including a piezoelectric capacitor, such as an AlN piezoelectric capacitor, as the active material can be developed and evaluated. Numerous wafers can be considered with varying liquids and locations to determine the range of frequency that can be used for tuning the devices.

The dummy devices can include a silicon beam with a silicon mass. Two types of devices may be developed. One type can involve etching the cavities in the silicon mass during the DRIE process, where the depth of the etching can be determined by the time and the thickness of a handle silicon used. To avoid etching through to the box layer, a hard mask (such as silicon dioxide) can be used to etch the mass, but to create the cavities a soft mask can be used. The cavity can be etched in the same process as the mass release etch. The soft mask (photoresist) can get etched away at a faster rate than the oxide mask, thus as the mass is etched approximately halfway, the photoresist mask can be removed and then the cavities can be etched as the remaining silicon is etched in the mass. This can provide a depth of approximately 250 μm (give or take due to etch rate aspect ratio dependencies). In the additive approach, a new mass can be created on the top surface using thick SU-8. SU-8 can be spin coated to thickness of hundreds of microns and the cavities can be easily created using photolithography.

Once the dummy devices are fabricated using the techniques previously discussed, the devices can be diced and used. Control dummy devices can consist of no liquid but can include the same parylene coating. Liquids can be dispensed in various devices at different locations and then parylene can be used to cap the liquids. The fabricated devices can be tested using a vibration shaker and a dynamic profilometer such as a digital holographic microscope. These machines measure displacement as a function of time, and can give frequency spectrums, where each device can be inspected, and the fabricated devices can be evaluated. The dummy devices can also be investigated for leakage, the devices can be set to vibrate at different accelerations and periods of time to determine if leakage of the fluid is occurring.

Upon completion of fabrication and investigation of dummy devices, fabrication of the full devices can be initiated. The fabrication can be similar to the dummy devices with the exception of having an active layer in the energy harvester such as having a metal/AlN/metal layer as the active layer in the energy harvester. Other materials may be used for the active layer. Several stress relieving layers can also be deposited. The cavities and mass technique with embedded liquids may depend on the results from developing and investing dummy devices. Devices can be diced and packaged on a custom made PCB and mounted using wire (ball) bonding techniques in order to form electrical interconnections.

After the devices have been fabricated and mounted on the PCB. The devices can be validated with respect to characteristics including resonant frequency. For devices including AlN, AlN test wafers can be used to characterize the piezoelectric properties and quality of the AlN film using X-ray powder diffraction (XRD) measurements and piezometer measurements. The energy harvesting devices can be mounted on a vibration shaker and connected to an oscilloscope via a variable resistor, as it is important to match the impedance of the device to the impedance of the resistor. The devices can be characterized by investigating power as function of frequency. The resonant frequency, bandwidth, and peak power can be measured. The results of these measurements can demonstrate the ability to tune the resonant frequency without reducing the power or altering the bandwidth, for the specific liquids selected and specific pattern of cavities able to hold liquids. The specific pattern of cavities can be a pattern having one of more cavities without embedded liquid.

In various embodiments, devices and methods can be implemented to further enhance the TRL of MEMS based vibrational EHs to power CPS and IoT applications by tuning the resonant frequency of the devices during the fabrication process. Such procedural techniques can lead to development of large scale production or batch fabrication methods to develop these devices. Society will benefit by the development of the next generation of IoT WSN that can be self-sustaining without a need for batteries. This can allow devices to operate without needing to replace batteries, which can be very labor intensive for some applications. Industry has struggled with MEMS EHs in that industry typically operates to mass produce devices that are universal or can be used for multiple applications, as the benefits from making thousands of different devices for each application are limited. The methods as taught herein may allow industry to make a single device and then fine tune the frequency in the last fabrication stage of deployment.

Data obtained from fabricating devices as taught herein for different liquid materials and cavity designs can be stored in one or more databases. Such databases can be arranged to be accessible databases, which may be shared with the public based on use. Key data can include frequency spectrums of various applications as well as details on the fabrication process and patterning effects due to location, liquids, and volume. An initial library consisting of liquid used, location, and volume of liquid and the effects of the resonant frequency can be placed in a repository that be made accessible to the public. The repository made be coupled to the Internet or other communication network. Data can be added to the library to enhance the database that will allow researchers or customers to choose settings for a specific resonant frequency device.

Figure 10:
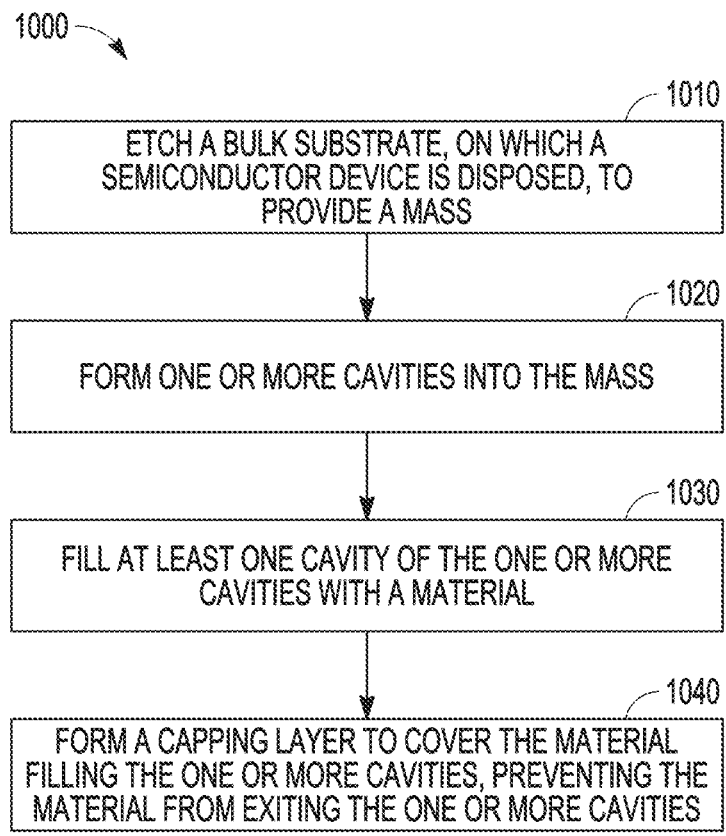
FIG. 10 is a flow diagram of features of an example method of fabricating a microelectromechanical system cantilever, in accordance with various embodiments.

FIG. 10 is a flow diagram of features of an embodiment of an example method of fabricating a MEMS cantilever. At 1010, a bulk substrate, on which a semiconductor device is disposed, is etched to provide a mass. The bulk substrate can be bulk silicon. Etching the bulk substrate can be accomplished by reactive-ion etching the bulk substrate or deep reactive-ion etching the bulk substrate. At 1020, one or more cavities are formed into the mass. Forming the one or more cavities into the mass can include etching the mass to form the one or more cavities.

At 1030, at least one cavity of the one or more cavities is filled with a material. The material can be realized by one or more liquids or one or more types of solid particles. Filling the one or more cavities can include partially filling the one or more cavities. The partially filled one or more cavities provides a sliding mass embedded in the mass attached to a cantilever provided by the bulk substrate. Filling the at least one cavity of the one or more cavities with a material can include dispensing a liquid into the at least one cavity.

At 1040, a capping layer is formed to cover the material, which at least partially fills one or more cavities, preventing the material from exiting the one or more cavities. The capping layer can be bonded to the mass using various wafer bonding techniques, which prevents the material from leaking out during operation. Parylene can be used as a material for the capping layer.

Variations of method 1000 or methods similar to method 1000 can include a number of different embodiments that may be combined depending on the application of such methods and/or the architecture of systems in which such methods are implemented. Such methods can include the semiconductor device having a piezoelectric material. Forming the piezoelectric material can include forming an aluminum nitride layer on a titanium layer and forming an aluminum layer on the aluminum nitride layer.

Variations of method 1000 or methods similar to method 1000 can include tuning a resonant frequency of the MEMS cantilever, with one or more liquids being the material filling at least one cavity of the one or more cavities, by controlling one or more liquid densities, amount of the one or more liquids, and location of the one or more liquids. The material can be realized alternatively by solid particles or in combinations with one or more liquids. Tuning the resonant frequency can include tuning in a range of approximately 20 Hz to approximately 250 Hz.

In various embodiments, an apparatus can comprise a cantilever beam and a mass coupled to the cantilever beam. The mass can have one or more cavities and a liquid or solid particles disposed in at least one cavity of the one or more cavities. A cap disposed on the mass covers the at least one cavity, preventing the liquid or solid particles from exiting the at least one cavity.

Variations of such an apparatus or similar apparatus can include a number of different embodiments that may be combined depending on the application of such apparatus and/or the architecture of systems in which such apparatus are implemented. The apparatus can include at least two different liquids disposed in the one or more cavities. At least one cavity having embedded liquid can include a material for the liquid that is different from the liquid material in other cavities having embedded liquid. The embedded liquid can partially fill the one or more cavities. The partially filled cavities provides a sliding mass embedded in the mass attached to the cantilever. The cap can have one or more of a polymer, silicon, or Pyrex.

Variations of such an apparatus or similar apparatus can include the apparatus having piezoelectric material disposed on the cantilever beam. The piezoelectric material can include aluminum nitride. Combination of the cantilever beam with the mass having embedded liquid can be tuned to a resonant frequency controlled by liquid density, amount of the liquid, and location of the embedded liquid.

In various embodiments, an energy harvesting system can comprise an energy harvesting device, a power management circuit to control the energy harvesting device, and an energy storage device to store energy generated from the energy harvesting device. The energy harvesting device can include a cantilever beam and a mass coupled to the cantilever beam, where the mass has one or more cavities. A liquid or solid particles are disposed in at least one cavity of the one or more cavities, and a cap is disposed on the mass covering the at least one cavity, preventing the liquid or solid particles from exiting the at least one cavity. The energy harvesting system can include a DC rectifier coupled to the energy harvesting device.

Variations of such an energy harvesting system or similar energy harvesting system can include a number of different embodiments that may be combined depending on the application of such apparatus and/or the architecture of systems in which such energy harvesting systems are implemented. The energy harvesting device can include piezoelectric material disposed on the cantilever beam. The piezoelectric material can include aluminum nitride. The energy harvesting device of such an energy harvesting system or similar energy harvesting system can be structured with one or more features as taught herein. The energy harvesting system can be incorporated in an Internet of Things or a cyber-physical system.

Figure 11:
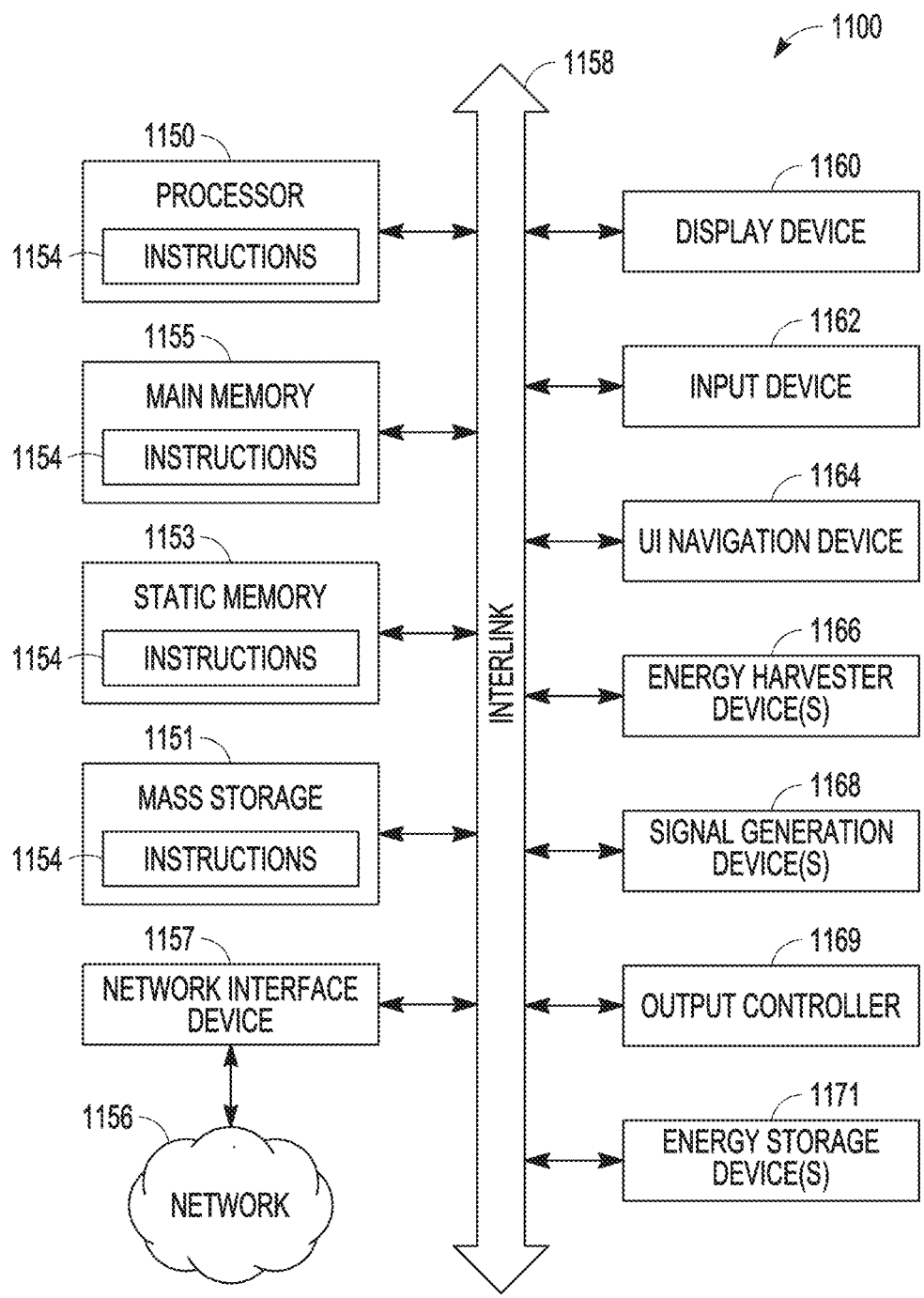
FIG. 11 is a block diagram illustrating components of an embodiment of an example system that can implement algorithms and perform methods structured to operate in conjunction with one or more microelectromechanical system energy harvesters, in accordance with various embodiments.

FIG. 11 is a block diagram illustrating components of an embodiment of an example system 1100 that can implement algorithms and perform methods structured to operate in conjunction with one or more MEMS EHs 1166 as taught herein. Energy collected by MEMS EHs 1166 can be stored in an energy storage device 1171 of system 1100. System 1100 can include one or more processors 1150 that can be structured to execute stored instructions to perform functions to control, manage, or use output of one or more cantilever beam EH device(s) 1166. The execution of stored instructions by the one or more processors 1150 can provide a power management circuit to control the energy harvesting device 1166.

System 1100 may operate as a standalone system or may be connected, for example networked, to other systems. In a networked deployment, system 1100 can operate in the capacity of a server machine, a client machine, or both in server-client network environments. In an example, system 1100 can act as a peer machine in peer-to-peer (P2P) (or other distributed) network environment. Further, while only a single system is illustrated, the term "system" shall also be taken to include any collection of systems that individually or jointly execute a set (or multiple sets) of instructions to perform any one or more of the methodologies discussed herein. System 1100 can be implemented as, or incorporated as part of, an Internet of Things or a cyber-physical system.

System 1100 can be a machine (e.g., a computer-based machine) and can include a hardware processor 1150 (e.g., a CPU, a GPU, a hardware processor core, or any combination thereof), a main memory 1155, and a static memory 1153, some or all of which can communicate with each other via components of an interlink (e.g., bus) 1158. The interlink 1158 can include a number of different communication mechanisms such as different wired communication mechanisms, different wireless communication mechanisms, and different power distribution networks. For example, interlink 1158 can be arranged to provide a direct link between energy harvesting device 1166 and energy storage device 1171.

System 1100 can further include a display device 1160, an alphanumeric input device 1162 (e.g., a keyboard), and a user interface (UI) navigation device 1164 (e.g., a mouse). In an example, display device 1160, input device 1162, and UI navigation device 1164 can be a touch screen display. System 1100 can additionally include a mass storage device (e.g., drive unit) 1151, one or more signal generation devices 1168. One or more signal generation devices 1168 can include one or more sources arranged to operate as a vibration source for one or more MEMS EHs 1166. One or more signal generation devices 1168 can also include one or more DC rectifiers coupled to one or more energy harvesting devices 1166. System 1100 can include sensors, such as a global positioning system (GPS) sensor, compass, accelerometer, or other communication-enabled sensors. System 1100 can include an output controller 1169, such as a serial (e.g., USB, parallel, or other wired or wireless (e.g., infrared (IR), near field communication (NFC), etc.) connection to communicate or control one or more peripheral devices (e.g., a printer, card reader, etc.).

System 1100 can include one or more machine-readable media on which is stored one or more sets of data structures or instructions 1154 (e.g., software) embodying or utilized by system 1100 to perform any one or more of the techniques or functions for which system 1100 is designed. Additionally, instructions 1154 can include processing algorithms for manufacturing one or more MEMS EHs 1166 using automated fabrication equipment. Instructions 1154 can also reside, completely or at least partially, within main memory 1155, within static memory 1153, or within hardware processor 1150 during execution thereof by system 1100. In an example, one or any combination of hardware processor 1150, main memory 1155, static memory 1153, or mass storage device 1151 can be implemented.

Instructions 1154 (e.g., software, programs, an operating system (OS), etc.) or other data can be stored on the mass storage device 1151 and can be accessed by main memory 1155 for use by processor 1150. Main memory 1155 (e.g., DRAM) is typically fast, but volatile, and thus a different type of storage than mass storage device 1151 (e.g., an SSD), which is suitable for long-term storage, including while in an "off" condition. Instructions 1154 or data in use by a user or system 1100 are typically loaded in main memory 1155 for use by processor 1150. When main memory 1155 is full, virtual space from mass storage device 1151 can be allocated to supplement main memory 1155; however, because mass storage device 1151 is typically slower than main memory 1155, and write speeds are typically at least twice as slow as read speeds, use of virtual memory can greatly reduce user experience due to storage device latency (in contrast to main memory 1155, e.g., DRAM). Further, use of mass storage device 1151 for virtual memory can greatly reduce the usable lifespan of mass storage device 1151.

Mass storage device 1151 can be arranged to include one or more databases. Data obtained from fabricating devices as taught herein for different liquid materials and cavity designs can be stored in one or more databases of mass storage device 1151, which may be made widely accessible. Key data can include frequency spectrums, including associated resonant frequencies, of various applications as well as details on the fabrication process and patterning effects due to location of material embedded in a cantilever mass, liquids or solid particles used, and relevant volumes. The repository made be coupled to the Internet or other communication network. Data can be added to the library to enhance the database.

Instructions 1154, data, results of data analysis, or power elements can further be transmitted or received over a network 1156 using a transmission medium via a network interface device 1157 utilizing any one of a number of transfer protocols (e.g., frame relay, Internet protocol (IP), transmission control protocol (TCP), user datagram protocol (UDP), hypertext transfer protocol (HTTP), power transfer protocols etc.). Example network 1156 can include one or more communication networks having a local area network (LAN), a wide area network (WAN), a packet data network (e.g., the Internet), mobile telephone networks (e.g., cellular networks), Plain Old Telephone (POTS) networks, and wireless data networks, among others. In an example, the network interface device 1157 can include one or more physical jacks (e.g., Ethernet, coaxial, or phone jacks) or one or more antennas to connect to the communications network 1156. In an example, the network interface device 1157 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions or data to and from system 1100 for execution by system 1100 and includes instrumentalities to propagate digital or analog communications signals to facilitate communication of such instructions, which instructions can be implemented by software.

Although specific embodiments have been illustrated and described herein, it will be appreciated by those of ordinary skill in the art that any arrangement that is calculated to achieve the same purpose may be substituted for the specific embodiments shown. Upon studying the disclosure, it will be apparent to those skilled in the art that various modifications and variations can be made in the devices and methods of various embodiments of the invention. Various embodiments can use permutations and/or combinations of embodiments described herein. Other embodiments will be apparent to those skilled in the art from consideration of the specification and practice of the embodiments disclosed herein. It is to be understood that the above description is intended to be illustrative, and not restrictive, and that the phraseology or terminology employed herein is for the purpose of description.

What is claimed is:

1. An apparatus comprising:
a cantilever beam;
a mass coupled to the cantilever beam, the mass having one or more cavities;
a liquid or solid particles disposed in at least one cavity of the one or more cavities; and
a cap disposed on the mass covering the at least one cavity, preventing the liquid or solid particles from exiting the at least one cavity.

2. The apparatus of claim 1, wherein at least two different liquids are disposed in the one or more cavities.

3. The apparatus of claim 1, wherein the cap includes one or more of a polymer, silicon, or Pyrex.

4. The apparatus of claim 1, wherein the apparatus includes piezoelectric material disposed on the cantilever beam.

5. The apparatus of claim 4, wherein the piezoelectric material includes aluminum nitride.

6. The apparatus of claim 1, wherein combination of the cantilever beam with the mass having embedded liquid is tuned to a resonant frequency controlled by liquid density, amount of the liquid, and location of the embedded liquid.

7. An energy harvesting system comprising:
   an energy harvesting device, the energy harvesting device including:
      a cantilever beam;
      a mass coupled to the cantilever beam, the mass having one or more cavities;
      a liquid or solid particles disposed in at least one cavity of the one or more cavities; and
      a cap disposed on the mass covering the at least one cavity,
   preventing the liquid or solid particles from exiting the at least one cavity;
   a power management circuit to control the energy harvesting device; and
   an energy storage device to store energy generated from the energy harvesting device.

8. The energy harvesting system of claim 7, wherein the energy harvesting system includes a DC rectifier coupled to the energy harvesting device.

9. The energy harvesting system of claim 7, wherein the energy harvesting device includes piezoelectric material disposed on the cantilever beam.

10. The energy harvesting system of claim 9, wherein the piezoelectric material includes aluminum nitride.

11. The energy harvesting system of claim 7, wherein the energy harvesting system is incorporated in an Internet of Things or a cyber-physical system.

12. A method of fabricating a microelectromechanical system (MEMS) cantilever, the method comprising:
   etching a bulk substrate, on which a semiconductor device is disposed, to provide a mass;
   forming one or more cavities into the mass;
   filling at least one cavity of the one or more cavities with a material; and
   forming a capping layer to cover the material filling the one or more cavities, preventing the material from exiting the one or more cavities.

13. The method of claim 12, wherein the bulk substrate is bulk silicon.

14. The method of claim 12, wherein etching the bulk substrate includes reactive-ion etching the bulk substrate or deep reactive-ion etching the bulk substrate.

15. The method of claim 12, wherein the semiconductor device includes a piezoelectric material.

16. The method of claim 15, wherein forming the piezoelectric material includes forming an aluminum nitride layer on a titanium layer and forming an aluminum layer on the aluminum nitride layer.

17. The method of claim 12, wherein forming the one or more cavities into the mass includes etching the mass to form the one or more cavities.

18. The method of claim 12, wherein filling the at least one cavity of the one or more cavities with a material includes dispensing a liquid into the at least one cavity.

19. The method of claim 12, wherein the method includes tuning a resonant frequency of the MEMS cantilever, with one or more liquids being the material filling at least one cavity of the one or more cavities, by controlling one or more liquid densities, amount of the one or more liquids, and location of the one or more liquids.

20. The method of claim 19, wherein tuning the resonant frequency includes tuning in a range of approximately 20 Hz to approximately 250 Hz.

\* \* \* \* \*